(12) United States Patent
Guo et al.

(10) Patent No.: US 11,893,922 B2
(45) Date of Patent: Feb. 6, 2024

(54) SHIFT REGISTER, GATE DRIVE CIRCUIT AND DISPLAY PANEL

(71) Applicant: YUNGU (GU'AN) TECHNOLOGY CO., LTD., Hebei (CN)

(72) Inventors: Enqing Guo, Langfang (CN); Cuili Gai, Langfang (CN); Ling Wang, Langfang (CN); Junfeng Li, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 18/339,409

(22) Filed: Jun. 22, 2023

(65) Prior Publication Data

US 2023/0335030 A1 Oct. 19, 2023

Related U.S. Application Data

(63) Continuation of application No. PCT/CN2021/131986, filed on Nov. 22, 2021.

(30) Foreign Application Priority Data

Jan. 29, 2021 (CN) .......................... 202110127280.2

(51) Int. Cl.
G09G 3/20 (2006.01)
G11C 19/28 (2006.01)

(52) U.S. Cl.
CPC .............. G09G 3/20 (2013.01); G11C 19/28 (2013.01); *G09G 2300/0819* (2013.01);
(Continued)

(58) Field of Classification Search
CPC ............. G09G 3/20; G09G 2300/0819; G09G 2300/0842; G09G 2300/0861;
(Continued)

(56) References Cited

U.S. PATENT DOCUMENTS

2008/0266477 A1 10/2008 Lee et al.
2010/0177087 A1 7/2010 Han
(Continued)

FOREIGN PATENT DOCUMENTS

CN 103000155 A 3/2013
CN 104318904 A 1/2015
(Continued)

OTHER PUBLICATIONS

International Search Report dated Feb. 7, 2022, in corresponding International Application No. PCT/CN2021/131986, 6 pages.
(Continued)

*Primary Examiner* — Abhishek Sarma
(74) *Attorney, Agent, or Firm* — Maier & Maier, PLLC

(57) ABSTRACT

A shift register, a gate drive circuit and a display panel. The shift register includes: a first input module, a second input module, a first output module, a second output module, a first output control module and a second output control module, the first input module is configured to control the potential of a first node according to a first start signal and a first clock signal; the second input module is configured to control the potential of a second node according to a second start signal and the first clock signal; the first output control module is configured to control the potential of the second node; the first output module is configured to transmit a first potential signal or a second potential signal to a first output terminal of the shift register according to the potential of the first node and the potential of the second node.

17 Claims, 12 Drawing Sheets

(52) U.S. Cl.
CPC ........... *G09G 2300/0842* (2013.01); *G09G 2300/0861* (2013.01); *G09G 2310/0202* (2013.01); *G09G 2310/0267* (2013.01); *G09G 2310/0286* (2013.01)

(58) Field of Classification Search
CPC ... G09G 2310/0202; G09G 2310/0267; G09G 2310/0286; G09G 2310/0262; G09G 3/3266; G09G 3/3674; G09G 2230/00; G11C 19/28; G11C 19/18
See application file for complete search history.

(56) References Cited

U.S. PATENT DOCUMENTS

| | | | |
|---|---|---|---|
| 2016/0329015 | A1* | 11/2016 | Ji .............................. G09G 3/32 |
| 2018/0374410 | A1 | 12/2018 | Zhu et al. |
| 2021/0366354 | A1* | 11/2021 | Li ......................... G09G 3/3266 |

FOREIGN PATENT DOCUMENTS

| | | |
|---|---|---|
| CN | 105304013 A | 2/2016 |
| CN | 105609042 A | 5/2016 |
| CN | 104882168 B | 9/2018 |
| CN | 108648716 A | 10/2018 |
| CN | 109859669 A | 6/2019 |
| CN | 209265989 U | 8/2019 |
| CN | 110197697 A | 9/2019 |
| CN | 110517620 A | 11/2019 |
| CN | 110689844 A | 1/2020 |
| CN | 110956919 A | 4/2020 |
| CN | 111583850 A | 8/2020 |
| CN | 111681700 A | 9/2020 |
| CN | 111696469 A | 9/2020 |
| CN | 111754915 A | 10/2020 |
| CN | 111916016 A | 11/2020 |
| CN | 112150961 A | 12/2020 |
| CN | 112802422 A | 5/2021 |
| WO | 2018129932 A1 | 7/2018 |
| WO | 2019080626 A1 | 5/2019 |

OTHER PUBLICATIONS

Ding et al., "Design of a gate-driving circuit with p type power MOSFET", Electronic Components and Materials, vol. 32, No. 12, Dec. 2013 (English Abstract Included), 4 pages.

Yang et al., "Design of Driving Circuit for VGA TFT LCD", Chinese J. of Liquid Crystals and Displays, vol. 16, No. 1, Mar. 2001 (English Abstract Included), 7 pages.

* cited by examiner

SHIFT REGISTER, GATE DRIVE CIRCUIT AND DISPLAY PANEL

CROSS-REFERENCE TO RELATED APPLICATIONS

This application is a continuation of International Patent Application No. PCT/CN2021/131986, filed on Nov. 22, 2021, which claims priority to Chinese Patent Application No. 202110127280.2 filed on Jan. 29, 2021, disclosures of both of which are incorporated herein by reference in their entireties.

TECHNICAL FIELD

The present application relates to display techniques, for example, to a shift register, a gate drive circuit and a display panel.

BACKGROUND

With the development of display techniques, people have increasingly higher requirements for the performance of display panels.

The display panel usually includes a gate drive circuit, and the gate drive circuit includes multiple cascaded shift registers. The structure of the shift register has some problems such as unstable output signals and the short pulse width of output signals, affecting the display effect of the display panel.

SUMMARY

The present application provides a shift register, a gate drive circuit and a display panel to extend the pulse width of an active signal output by the shift register and improve the stability of the output signal of the shift register.

The present application provides a shift register. The shift register includes a first input module, a second input module, a first output module, a second output module, a first output control module and a second output control module.

The first input module is configured to control a potential of a first node according to a first start signal and a first clock signal, the second input module is configured to control a potential of a second node according to a second start signal and the first clock signal, and the potential of the second start signal is opposite to the potential of the first start signal.

The first output control module is configured to control the potential of the second node according to the potential of the first node, a first potential signal and a second clock signal, and the first output module is configured to transmit the first potential signal or a second potential signal to a first output terminal of the shift register according to the potential of the first node and the potential of the second node.

The second output control module is configured to control a potential of a third node connected to the first node according to the potential of the first output terminal, the first potential signal and the second clock signal, and the second output module is configured to transmit the first potential signal or the second potential signal to a second output terminal of the shift register according to the potential of the first output terminal and the potential of the third node.

An embodiment of the present application further provides a gate drive circuit. The gate drive circuit includes multiple shift registers, and the multiple shift registers are cascaded.

A first start signal input terminal of a first stage shift register is configured to access the first start signal, a second start signal input terminal of the first stage shift register is configured to access the second start signal, a first output terminal of the first stage shift register is electrically connected to a second start signal input terminal of a next stage shift register, and a second output terminal of the first stage shift register is electrically connected to a first start signal input terminal of the next stage shift register.

The present application further provides a display panel. The display panel includes the preceding gate drive circuit and further includes a first clock signal line, a second clock signal line, a first potential signal line and a second potential signal line.

The first clock signal line is configured to transmit a first clock signal to the shift register, the second clock signal line is configured to transmit a second clock signal to the shift register, the first potential signal line is configured to transmit a first potential signal to the shift register, and the second potential signal line is configured to transmit a second potential signal to the shift register.

The shift register, the gate drive circuit and the display panel provided by the present application adjust the pulse width of the active signals of the output signals of the first output terminal and the second output terminal of the shift register by adjusting the pulse width of the active signal of the first start signal. When the pulse width of the active signal of the first start signal is set to be larger than the pulse width of the active signals of the first clock signal and the second clock signal, the pulse width of the active signal of the output signal of the shift register is also larger than the pulse width of the active signal of the clock signal, and the level loss of the output signal of the shift register can also be reduced through the first output control module and the second output control module. Compared with the existing art, the solutions of the present application can extend the pulse width of the active signal output by the shift register and improve the stability of the output signal of the shift register. When the output signal of the shift register is used as a gate drive signal of a transistor for initializing the gate of the drive transistor and the anode of the light-emitting device, the initialization time of the gate of the drive transistor and the anode of the light-emitting device can be increased, thereby alleviating problems such as the afterimage of the display image and the display abnormality caused by insufficient initialization time and improving the display effect. In addition, since the pulse width of the active signal of the output signal of the shift register is wide and the stability of the output signal is good, the output signal of the shift register can also be used as the gate drive signal of the light emission control transistor, thereby improving the display effect.

DETAILED DESCRIPTION

The present application is described below in conjunction with drawings and embodiments.

As described in the background, the structure of the shift register has problems such as unstable output signals and the short pulse width of output signals, affecting the display effect of the display panel. The reasons for the preceding problems are that the display panel includes a light-emitting device and a pixel circuit for driving the light-emitting device to work, the pixel circuit includes a drive transistor, a transistor for initializing the anode of the light-emitting device and a transistor for initializing the gate of the drive transistor, and a gate drive circuit composed of the shift register can supply gate drive signals for multiple transistors in the pixel circuit. The pulse width of an active signal output by the shift register in the related art usually depends on the pulse width of a clock signal input to the shift register. When the display panel works in an operating condition of a high refresh rate, the line scan time for driving the pixel circuit to work is very short. The clock signal input to the shift register is limited by the line scan time, and thus the pulse width of the clock signal is short. Consequently, the output signal of the shift register is also a short pulse signal. Therefore, the pulse width of the gate drive signal for initializing the transistor in the pixel circuit is also short so that the initialization time of the light-emitting device is insufficient, causing the afterimage of the display image, and the initialization time of the drive transistor gate is insufficient, causing the unevenness of the display image and even display abnormality. Moreover, the output signal of the shift register in the related art is unstable, and a level loss problem exists, affecting the display effect of the display panel.

Figure 1:
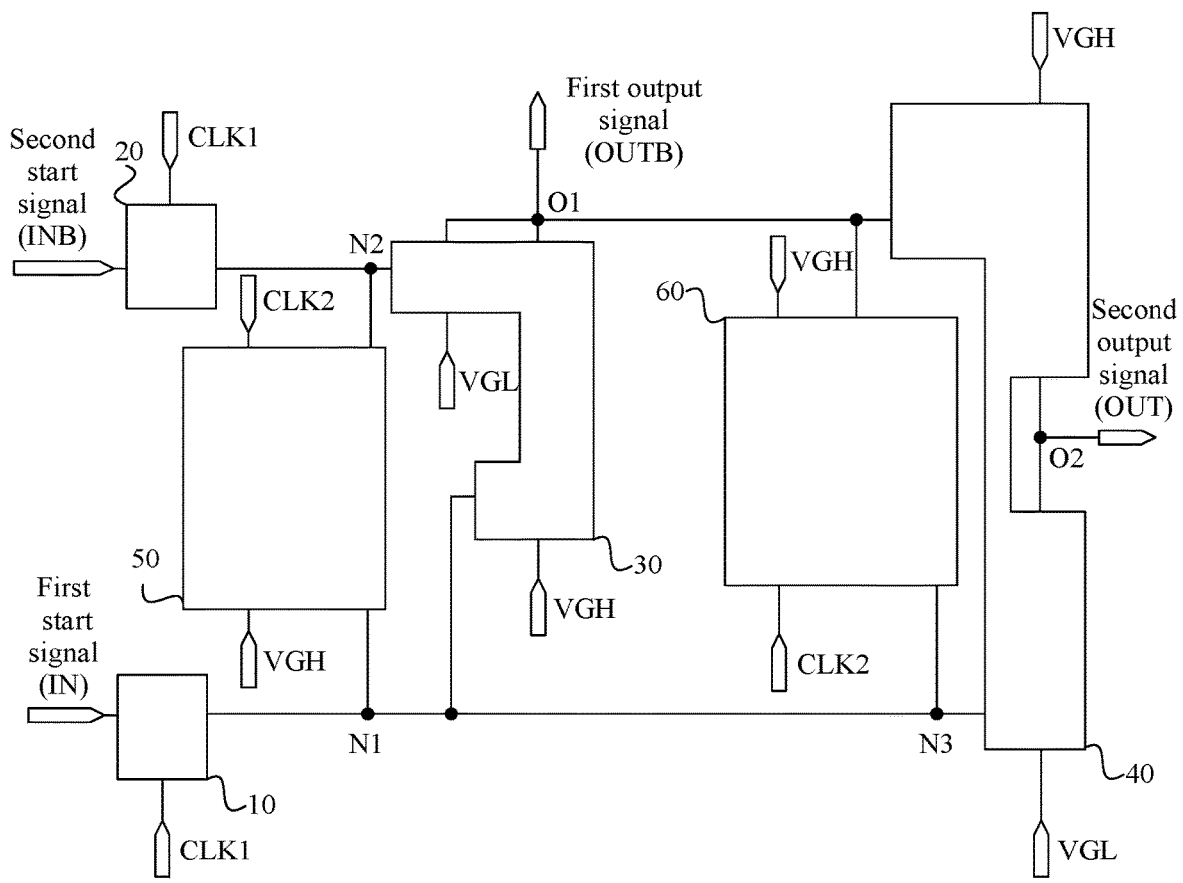
FIG. 1 is a schematic diagram of the module structure of a shift register according to an embodiment of the present application.

An embodiment of the present application provides a shift register. FIG. 1 is a schematic diagram of the module structure of a shift register according to an embodiment of the present application. As shown in FIG. 1, the shift register includes a first input module 10, a second input module 20, a first output module 30, a second output module 40, a first output control module 50 and a second output control module 60. The first input module 10 is configured to control the potential of a first node N1 according to a first start signal IN and a first clock signal CLK1. The second input module 20 is configured to control the potential of a second node N2 according to a second start signal INB and the first clock signal CLK1. The potential of the second start signal INB is opposite to the potential of the first start signal IN. The first output control module 50 is configured to control the potential of the second node N2 according to the potential of the first node N1, a first potential signal VGH and a second clock signal CLK2. The first output module 30 is configured to transmit the first potential signal VGH or a second potential signal VGL to a first output terminal O1 of the shift register according to the potential of the first node N1 and the potential of the second node N2. The second output control module 60 is configured to control the potential of a third node N3 connected to the first node N1 according to the potential of the first output terminal O1, the first potential signal VGH and the second clock signal CLK2. The second output module 40 is configured to transmit the first potential signal VGH or the second potential signal VGL to a second output terminal O2 of the shift register according to the potential of the first output terminal O1 and the potential of the third node N3.

The first start signal IN may be a pulse signal whose pulse width is adjustable. For example, the pulse width of the active signal of the first start signal IN is larger than the pulse width of the active signals of the first clock signal CLK1 and the second clock signal CLK2. The potential of the second start signal INB is opposite to the potential of the first start signal IN. For example, when the first start signal IN is low, the second start signal INB is high, or when the first start signal IN is high, the second start signal INB is low. The shift register may generate an inverse signal of the first start signal IN according to the received first start signal IN through its internal structure to obtain the second start signal INB. For example, the shift register may include a phase inverter, and the shift register may obtain the inverse signal (that is, the second start signal INB) of the first start signal IN through the phase inverter and inputs the second start signal INB to the second input module 20.

The active level signal among the first clock signal CLK1, the second clock signal CLK2, the potential signal of the first node N1, the potential signal of the second node N2, the potential signal of the third node N3 and the potential signal of the first output terminal O1 may be a low-level signal or a high-level signal. The potential of the first potential signal VGH is opposite to the potential of the second potential signal VGL. For example, when the first potential signal VGH is a high-level signal, the second potential signal VGL is a low-level signal, or when the first potential signal VGH is a low-level signal, the second potential signal VGL is a high-level signal. In this embodiment and the following embodiments, the active level signal among the first clock signal CLK1, the second clock signal CLK2, the potential signal of the first node N1, the potential signal of the second node N2, the potential signal of the third node N3 and the potential signal of the first output terminal O1 is a low-level signal, the first potential signal VGH is a high-level signal, and the second potential signal VGL is a low-level signal.

The third node N3 may be connected to the first node N1 in a direct electrical connection or in an indirect electrical connection, and the connection manner is not limited to the embodiments of the present application.

The first input module 10 controls the potential of the first node N1 according to the first start signal IN and the first clock signal CLK1, meaning that the first input module 10 can transmit the first start signal IN to the first node N1 in response to the active level signal of the first clock signal CLK1. The second input module 20 controls the potential of the second node N2 according to the second start signal INB and the first clock signal CLK1, meaning that the second input module 20 can transmit the second start signal INB to the second node N2 in response to the active level signal of the first clock signal CLK1.

The first output module 30 transmits the first potential signal VGH or the second potential signal VGL to the first output terminal O1 of the shift register according to the potential of the first node N1 and the potential of the second node N2, meaning that the first output module 30 can transmit the first potential signal VGH to the first output terminal O1 in response to the active level signal of the first node N1 and transmit the second potential signal VGL to the first output terminal O1 in response to the active level signal of the second node N2. Since the first input module 10 can control the potential of the first node N1 according to the first start signal IN and the first clock signal CLK1, the potential of the first node N1 affects the duration in which the first output terminal O1 outputs the first potential signal VGH, and thus the pulse width of the first potential signal VGH output by the first output terminal O1 can be adjusted by adjusting the pulse width of the first start signal IN in combination with the control of the first clock signal CLK1. Since the second input module 20 can control the potential of the second node N2 according to the second start signal INB and the first clock signal CLK1, the potential of the second node N2 affects the duration in which the first output terminal O1 outputs the second potential signal VGL, and thus the pulse width of the second potential signal VGL output by the first output terminal O1 can be adjusted by adjusting the pulse width of the second start signal INB in combination with the control of the first clock signal CLK1. Since the pulse width of the second start signal INB depends on the pulse width of the first start signal IN, in the solution of this embodiment, the pulse width of the active signal of the output signal of the first output terminal O1 of the shift register can be adjusted by adjusting the pulse width of the active signal of the first start signal IN. When the pulse width of the active signal of the first start signal IN is set to be larger than the pulse width of the active signals of the first clock signal CLK1 and the second clock signal CLK2, the pulse width of the active signal of the output signal of the first output terminal O1 is also larger than the pulse width of the active signals of the first clock signal CLK1 and the second clock signal CLK2.

The first output control module 50 controls the potential of the second node N2 according to the potential of the first node N1, the first potential signal VGH and the second clock signal CLK2, meaning that the first output control module 50 can control the potential of the second node N2 according to the potential of the first node N1, the first potential signal VGH and the second clock signal CLK2 when a jump occurs in the potential of the second clock signal CLK2, for example, the first output control module 50 can pull down the potential of the second node N2 to a potential lower than the potential corresponding to the second potential signal VGL. Since the first output module 30 can transmit the second potential signal VGL to the first output terminal O1 in response to the active level signal (such as a low-level signal) of the second node N2, if the potential of the second node N2 is not sufficiently low (that is, the absolute value of the difference between the potential of the second node N2 and the second potential signal VGL is greater than a set threshold), a level loss may occur in the second potential signal VGL transmitted by the first output module to the first output terminal O1. In this embodiment, when the first output module 30 is set to transmit the second potential signal VGL to the first output terminal O1 in response to the low-level signal of the second node N2, the potential of the second node N2 is pulled down by the first output control module 50 to a potential lower than the potential of the second level signal VGL so that the potential of the second node N2 can reach a sufficiently low potential (the sufficiently low potential satisfies that the absolute value of the difference between the potential of the second node N2 and the second potential signal VGL is less than the set threshold), thereby reducing the level loss of the low-level signal output by the first output terminal O1. When the first output module includes a gate connected to the second node N2, a first electrode connected to the second potential signal VGL and a second electrode connected to a transistor of the first output terminal O1, the set threshold may be equal to the threshold voltage of the transistor.

The second output module 40 transmits the first potential signal VGH or the second potential signal VGL to the second output terminal O2 of the shift register according to the potential of the first output terminal O1 and the potential of the third node N3, meaning that the second output module 40 can transmit the first potential signal VGH to the second output terminal O2 in response to the active level signal of the first output terminal O1 and transmit the second potential signal VGL to the first second output terminal O2 in response to the active level signal of the third node N3. Since the potential of the first output terminal O1 affects the duration in which the second output terminal O2 outputs the first potential signal VGH and the potential of the first output terminal O1 is controlled by the first start signal IN, the pulse width of the first potential signal VGH output by the second output terminal O2 can be adjusted when the pulse width of the active signal of the output signal of the first output terminal O1 is adjusted by adjusting the pulse width of the active signal of the first start signal IN. Since the potential of the third node N3 affects the duration in which the second output terminal O2 outputs the second potential signal VGL, the potential of the third node N3 is the same as the potential of the first node N1 and the first input module 10 can control the potential of the first node N1 according to the first start signal IN and the first clock signal CLK1, the pulse width of the second potential signal VGL output by the second output terminal O2 can be adjusted when the pulse width of the first start signal IN is adjusted. Therefore, in the solution of this embodiment, the pulse width of the active signal of the output signal of the second output terminal O2 of the shift register can be adjusted by adjusting the pulse width of the active signal of the first start signal IN. When the pulse width of the active signal of the first start signal IN is set to be larger than the pulse width of the active signals of the first clock signal CLK1 and the second clock signal CLK2, the pulse width of the active signal of the output signal of the second output terminal O2 is also larger than the pulse width of the active signals of the first clock signal CLK1 and the second clock signal CLK2.

The second output control module 60 controls the potential of the third node N3 according to the potential of the first output terminal O1, the first potential signal VGH and the second clock signal CLK2, meaning that the second output control module 60 can control the potential of the third node N3 according to the potential of the first output terminal O1, the first potential signal VGH and the second clock signal CLK2 when a jump occurs in the potential of the second clock signal CLK2. For example, the second output control module 60 can pull down the potential of the third node N3 to a potential lower than the potential corresponding to the second potential signal VGL. Since the second output module 40 can transmit the second potential signal VGL to the second output terminal O2 in response to the active level signal (such as a low-level signal) of the third node N3, if the potential of the third node N3 is not sufficiently low (that is, the absolute value of the difference between the potential of the third node N3 and the second potential signal VGL is greater than a set threshold), a level loss may occur in the second potential signal VGL transmitted by the second output module 40 to the second output terminal O2. In this embodiment, when the second output module 40 is set to transmit the second potential signal VGL to the second output terminal O2 in response to the low-level signal of the third node N3, the potential of the third node N3 is pulled down by the second output control module 60 to a potential lower than the potential of the second potential signal VGL so that the potential of the third node N3 can reach a sufficiently low potential (the sufficiently low potential satisfies that the absolute value of the difference between the potential of the third node N3 and the second potential signal VGL is less than the set threshold value), thereby reducing the level loss of the low-level signal output by the second output terminal O2. When the second output module 40 includes a gate connected to the third node N3, a first electrode connected to the second potential signal VGL and a second electrode connected to a transistor of the second output terminal O2, the set threshold may be equal to the threshold voltage of the transistor.

In the solution of this embodiment of the present application, the pulse width of the active signals of the output signals of the first output terminal and the second output terminal is adjusted by adjusting the pulse width of the active signal of the first start signal. When the pulse width of the active signal of the first start signal is set to be larger than the pulse width of the active signals of the first clock signal and the second clock signal, the pulse width of the active signals of the output signals of the first output terminal and the second output terminal of the shift register is also larger than the pulse width of the active signal of the clock signal, and the level loss of the output signal of the shift register can also be reduced through the first output control module and the second output control module. Compared with the existing art where the pulse width of the output signal of the shift register depends on the pulse width of the clock signal, the solution of this embodiment of the present application can extend the pulse width of the active signal output by the shift register and improve the stability of the output signal of the shift register. The shift register provided by this embodiment of the present application may be applied in the gate drive circuit of the display panel, and the gate drive signal is provided by the shift register for the transistors in the pixel circuit of the display panel, for example, the output signal of the second output terminal of the shift register may be used as the gate drive signal. When the output signal of the shift register is used as the gate drive signal of the transistor for initializing the gate of the drive transistor and the anode of the light-emitting device in the pixel circuit, the initialization time of the gate of the drive transistor and the anode of the light-emitting device can be increased, thereby alleviating problems such as the afterimage of the display image and the display abnormality caused by insufficient initialization time and improving the display effect. In addition, the pixel circuit further includes a light emission control transistor for controlling the light emission stage of the light-emitting device, and since the pulse width of the active signal of the output signal of the shift register in this solution is wide and the stability of the output signal is good, the output signal of the shift register can also be used as the gate drive signal of the light emission control transistor, thereby improving the display effect.

Figure 2:
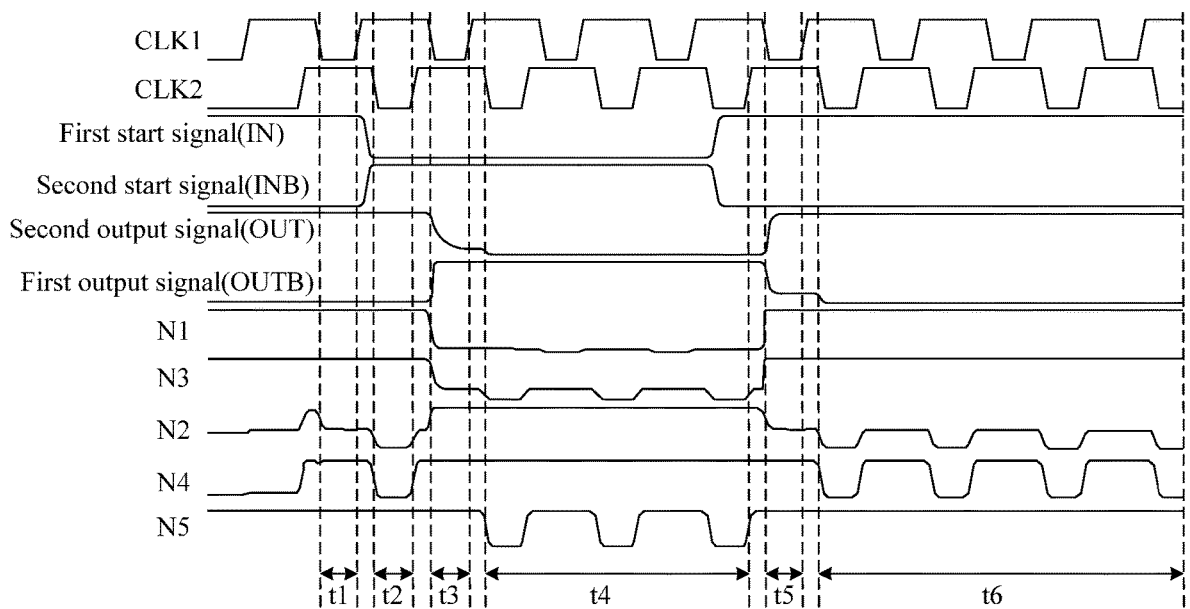
FIG. 2 is a drive timing diagram of a shift register according to an embodiment of the present application.

FIG. 2 is a drive timing diagram of a shift register according to an embodiment of the present application. The drive timing may be used for driving the shift register shown in FIG. 1. The working process of the shift register provided by the embodiment of the present application is described below in conjunction with the FIGS. 1 and 2. For example, the working process of the shift register includes a first stage t1, a second stage t2, a third stage t3, a fourth stage t4, a fifth stage t5 and a sixth stage t6. Optionally, the pulse width of the first start signal IN is larger than the pulse width of the first clock signal CLK1 and the second clock signal CLK2.

At the first stage t1, the first clock signal CLK1 is low, the second clock signal CLK2 is high, the first start signal IN is high, and the second start signal INB is low. The first input module 10 transmits the first start signal IN to the first node N1 in response to the low-level signal of the first clock signal CLK1 such that the potential of the first node N1 is high. The second input module transmits the second start signal INB to the second node N2 in response to the low-level signal of the first clock signal CLK1 such that the potential of the second node N2 is low. The first output module 30 transmits the second potential signal VGL to the first output terminal O1 in response to the low-level signal of the second node N2 such that the first output signal OUTB is a low-level signal. The potential of the third node N3 is the same as the potential of the first node N1, and the two are high. The second output module 40 transmits the first potential signal VGH to the second output terminal O2 in response to the low-level signal of the first output terminal O1 such that the second output signal OUT is a high-level signal. At the first stage t1, the first output signal OUTB coincides with the second start signal INB, and the second output signal OUT coincides with the first start signal IN.

At the second stage t2, the first clock signal CLK1 is high, the second clock signal CLK2 jumps from the high level to the low level, the first start signal IN is low, and the second start signal INB is high. The first input module 10 stops transmitting the first start signal IN, and the potential of the first node N1 remains high as at the previous stage. The second input module 20 stops transmitting the second start signal INB, and the potential of the second node N2 remains low as at the previous stage. The first output control module 50 pulls down the potential of the second node N2 to a potential lower than the potential of the low-level signal according to the potential of the first node N1, the first potential signal VGH and the second clock signal CLK2 when a jump occurs in the second clock signal CLK2 to ensure that the first output module 30 continues to transmit the second potential signal VGL to the first output terminal O1 in response to the low-level signal of the second node N2 such that the first output signal OUTB is still a low-level signal. The potential of the third node N3 is the same as the potential of the first node N1, and the two are high. The second output module 40 continues to transmit the first potential signal VGH to the second output terminal O2 in response to the low-level signal of the first output terminal O1 such that the second output signal OUT is a high-level signal. At the second stage t2, the first output signal OUTB still coincides with the second start signal INB, and the second output signal OUT still coincides with the first start signal IN.

At the third stage t3, the first clock signal CLK1 is low, the second clock signal CLK2 is high, the first start signal IN is low, and the second start signal INB is high. The first input module 10 transmits the first start signal IN to the first node N1 such that the potential of the first node N1 is low. The second input module 20 transmits the second start signal INB to the second node N2 such that the potential of the second node N2 is high. The first output module 30 transmits the first potential signal VGH to the first output terminal O1 in response to the low-level signal of the first node N1 such that the first output signal OUTB is a high-level signal. The potential of the third node N3 is the same as the potential of the first node N1, and the two are low. The second output module 40 transmits the second potential signal VGL to the second output terminal O2 in response to the low-level signal of the third node N3 such that the second output signal OUT is a low-level signal. At the third stage t3, the first output signal OUTB is inverted and coincides with the inverted second start signal INB, and the second output signal OUT is inverted and coincides with the inverted first start signal IN.

At the fourth stage t4, the first start signal IN remains low, and the second start signal INB remains high. When the first clock signal CLK1 jumps from the low level of the third stage t3 to the high level and the second clock signal CLK2 jumps from the high level of the third stage t3 to the low level, the first input module 10 stops transmitting the first start signal IN, and the potential of the first node N1 remains low as at the previous stage. The second input module 20 stops transmitting the second start signal INB, and the potential of the second node N2 remains high as at the previous stage. The potential of the third node N3 is the same as the potential of the first node N1, and the two are low. The first output module 30 continues to transmit the first potential signal VGH to the first output terminal O1 such that the first output signal OUTB is a high-level signal. The second output control module 60 pulls down the potential of the third node N3 to a potential lower than the potential of the low-level signal according to the potential of the first output terminal O1, the first potential signal VGH and the second clock signal CLK2 when a jump occurs in the potential of the second clock signal CLK2 (as shown in FIG. 2, the potential of the third node N3 becomes lower when the third stage t3 is transitioned to the fourth stage t4) to ensure that the second output module 40 continues to transmit the second potential signal VGL to the second output terminal O2 in response to the low-level signal of the third node N3 such that the second output signal OUT is a low-level signal, thereby reducing the level loss of the low-level signal output by the second output terminal O2. At the fourth stage t4, the first output signal OUTB remains a high-level signal, and the second output signal OUT remains a low-level signal.

At the fifth stage t5, the first clock signal CLK1 is low, the second clock signal CLK2 is high, the first start signal IN is high, and the second start signal INB is low. The first input module 10 transmits the first start signal IN to the first node N1 such that the potential of the first node N1 is high. The second input module 20 transmits the second start signal INB to the second node N2 such that the potential of the second node N2 is low. The first output module 30 transmits the second potential signal VGL to the first output terminal O1 in response to the low-level signal of the second node N2 such that the first output signal OUTB is a low-level signal. The potential of the third node N3 is the same as the potential of the first node N1, and the two are high. The second output module 40 transmits the first potential signal VGH to the second output terminal O2 in response to the low-level signal of the first output terminal O1 such that the second output signal OUT is a high-level signal. At the fifth stage t5, the first output signal OUTB is inverted and coincides with the inverted second start signal INB, and the second output signal OUT is inverted and coincides with the inverted first start signal IN.

At the sixth stage t6, the first start signal IN remains high, and the second start signal INB remains low. When the first clock signal CLK1 jumps from the low level of the fifth stage t5 to the high level and the second clock signal CLK2 jumps from the high level of the fifth stage t5 to the low level, the first input module 10 stops transmitting the first start signal IN, and the potential of the first node N1 remains high as at the previous stage. The second input module 20 stops transmitting the second start signal INB, and the potential of the second node N2 remains low as at the previous stage. The first output control module 50 pulls down the potential of the second node N2 to a potential lower than the potential of the low-level signal according to the potential of the first node N1, the first potential signal VGH and the second clock signal CLK2 when a jump occurs in the second clock signal CLK2 (as shown in FIG. 2, the potential of the second node N2 becomes lower when the fifth stage t5 is transitioned to the sixth stage t6) to ensure that the first output module 30 continues to transmit the second potential signal VGL to the first output terminal O1 in response to the low-level signal of the second node N2 such that the first output signal OUTB is still a low-level signal, thereby reducing the level loss of the low-level signal output by the first output terminal O1. The potential of the third node N3 is the same as the potential of the first node N1, and the two are high. The second output module 40 continues to transmit the first potential signal VGH to the second output terminal O2 in response to the low-level signal of the first output terminal O1 such that the second output signal OUT is a high-level signal. At the sixth stage t6, the first output signal OUTB remains consistent with the second start signal INB, and the second output signal OUT remains consistent with the first start signal IN.

In the solution of this embodiment, when the pulse width of the low-level signal of the first start signal IN is set to be larger than the pulse width of the low-level signals of the first clock signal CLK1 and the second clock signal CLK2, the first start signal IN can be shifted by the shift register to obtain the second output signal OUT, and the second start signal INB can be shifted to obtain the first output signal OUTB. Compared with the related art, the pulse width of the low-level signals of the first output signal OUTB and the second output signal OUT of the shift register is larger than the pulse width of the low-level signal of the clock signal, the low-level loss of the first output signal OUTB of the shift register is reduced through the first output control module 50, and the low level loss of the second output signal OUT of the shift register is reduced through the second output control module 60, which facilitates the prolonging of the low level time of the output signal of the shift register and facilitates the prolonging of the initialization time of the gate of the drive transistor and the anode of the light-emitting device when the output signal of the shift register is used as the gate drive signal of the initialization transistor in the pixel circuit, thereby alleviating problems such as the after-image of the display image and the display abnormality caused by insufficient initialization time and improving the display effect. When the output signal of the shift register is used as the gate drive signal of the light emission control transistor in the pixel circuit, the display effect is also improved. In addition, since the gate drive circuit in the display panel generally includes multiple cascaded shift registers and the shift register in this embodiment can shift the first start signal IN to obtain the second output signal OUT and shift the second start signal INB to obtain the first output signal OUTB, when the shift register is applied to the gate drive circuit, the second output signal OUT output by the current stage shift register can also serve as the first start signal IN input to the next stage shift register, and the first output signal OUTB output from the current stage shift register can also serve as the second start signal INB input to the next stage shift register, thereby facilitating the transfer of the output signal of the current stage shift register to the next stage shift register. Further, the low level loss of the output signal of the shift register can be reduced through the first output control module 50 and the second output control module 60, thereby reducing the level loss of the signal transmitted from the current stage shift register to the next stage shift register.

Figure 3:
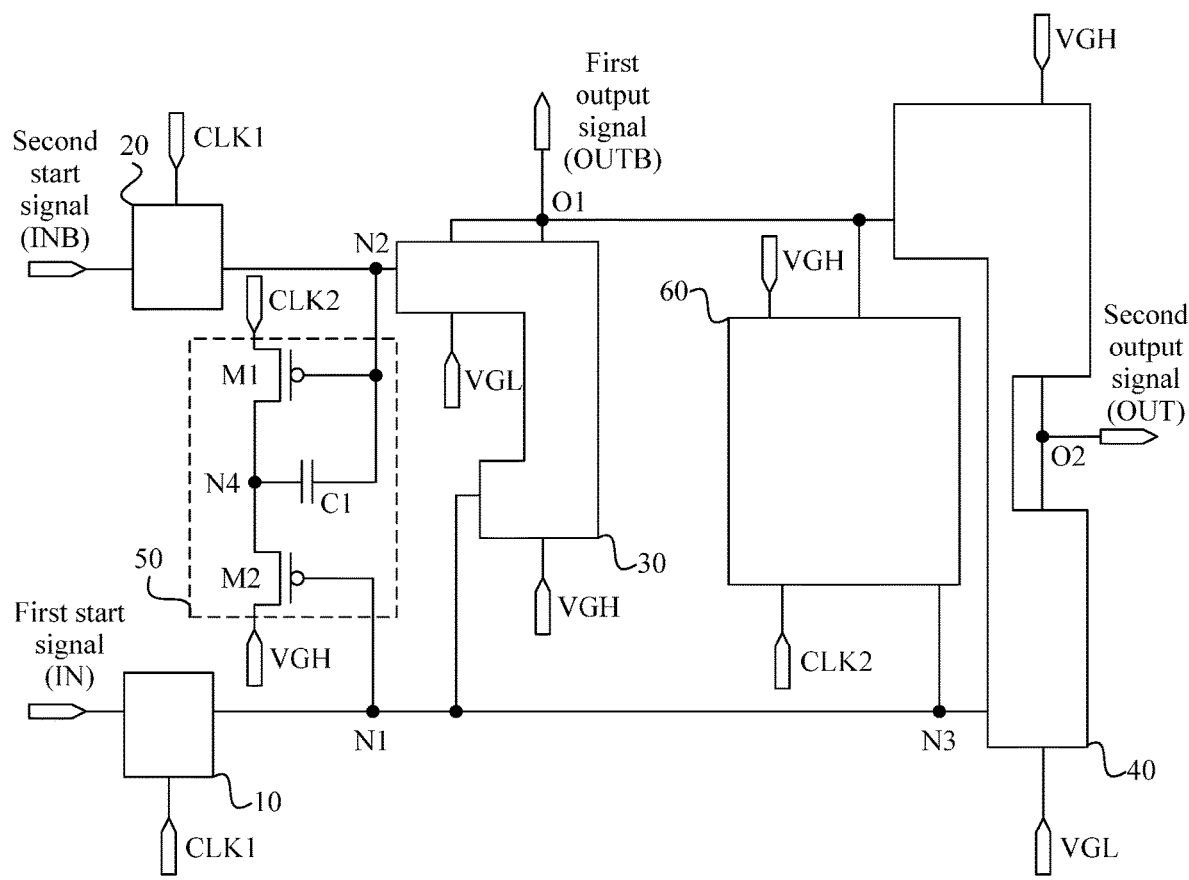
FIG. 3 is a schematic diagram of a module structure of another shift register according to an embodiment of the present application.

FIG. 3 is a schematic diagram of the module structure of another shift register according to an embodiment of the present application. As shown in FIG. 3, optionally, the first output control module 50 is configured to, in a case where the potential of the first node N1 and the first potential signal VGH are a first potential and the second clock signal CLK2 jumps from the first potential to a second potential, pull down the potential of the second node N2 to a potential lower than the potential of the second potential signal VGL. The first output control module 50 includes a first transistor M1, a second transistor M2 and a first capacitor C1. The gate of the first transistor M1 is connected to the second node N2 and the second terminal of the first capacitor C1, the first electrode of the first transistor M1 inputs the second clock signal CLK2, and the second electrode of the first transistor M1 is connected to the first terminal of the first capacitor C1 and the second electrode of the second transistor M2; the gate of the second transistor M2 is connected to the first node N1, and the first electrode of the second transistor M2 inputs the first potential signal VGH.

The drive timing diagram of the shift register shown in FIG. 2 can also be used to drive the shift register shown in FIG. 3 to work. In conjunction with FIGS. 2 and 3, for example, the first potential of the second clock signal CLK2 may be the potential of the high level, and the second potential may be the potential of the low level. When the drive timing of the shift register is transitioned from the fifth stage t5 to the sixth stage t6, the second clock signal CLK2 jumps from the first potential to the second potential. The first output control module 50 can pull down the potential of the second node N2 to a potential lower than the potential of the second potential signal VGL according to the potential of the first node N1, the first potential signal VGH and the second clock signal CLK2, that is, the potential of the second node N2 is pulled down to a potential lower the potential of the low-level signal, to ensure that the first output module 30 continues to transmit the second potential signal VGL to the first output terminal O1 in response to the low-level signal of the second node N2 such that the first output signal OUTB is still a low-level signal, thereby reducing the level loss of the low-level signal output by the first output terminal O1.

The first transistor M1 and the second transistor M2 in the first output control module 50 may be p-type transistors or n-type transistors. This embodiment and the following embodiments are illustrated using an example that multiple transistors in the shift register are all p-type transistors.

The first transistor M1 is turned on in response to the low-level signal of the second node N2 and transmits the second clock signal CLK2 to a fourth node N4 between the first transistor M1 and the second transistor M2 when it is on. The second transistor M2 is turned on in response to the low-level signal of the first node N1 and transmits the first potential signal VGH to the fourth node N4 when it is on. In conjunction with FIGS. 2 and 3, at the fifth stage t5, the potential of the first node N1 is high, the potential of the second node N2 is low, the second transistor M2 is off, the first transistor M1 is on, and the second clock signal CLK2 is transmitted to the fourth node N4 such that the potential of the fourth node N4 is high. A potential difference is formed across the first capacitor C1, and the first capacitor C1 is charged. When the fifth stage t5 is transitioned to the sixth stage t6, the second clock signal CLK2 jumps from the first potential to the second potential, the potential of the second node N2 is close to the low potential, and the first transistor M1 continues to be on and transmits the second clock signal CLK2 to the fourth node N4 such that the potential of the fourth node N4 changes from the high potential to the low potential. Due to the coupling action of the first capacitor C1, the first capacitor C1 can couple the potential of the second node N2 to a very low potential lower than the low potential to ensure that the first output module 30 continues to transmit the second potential signal VGL to the first output terminal O1 in response to the low-level signal of the second node N2 such that the first output signal OUTB is still a low-level signal, thereby reducing the level loss of the low-level signal output by the first output terminal O1.

Figure 4:
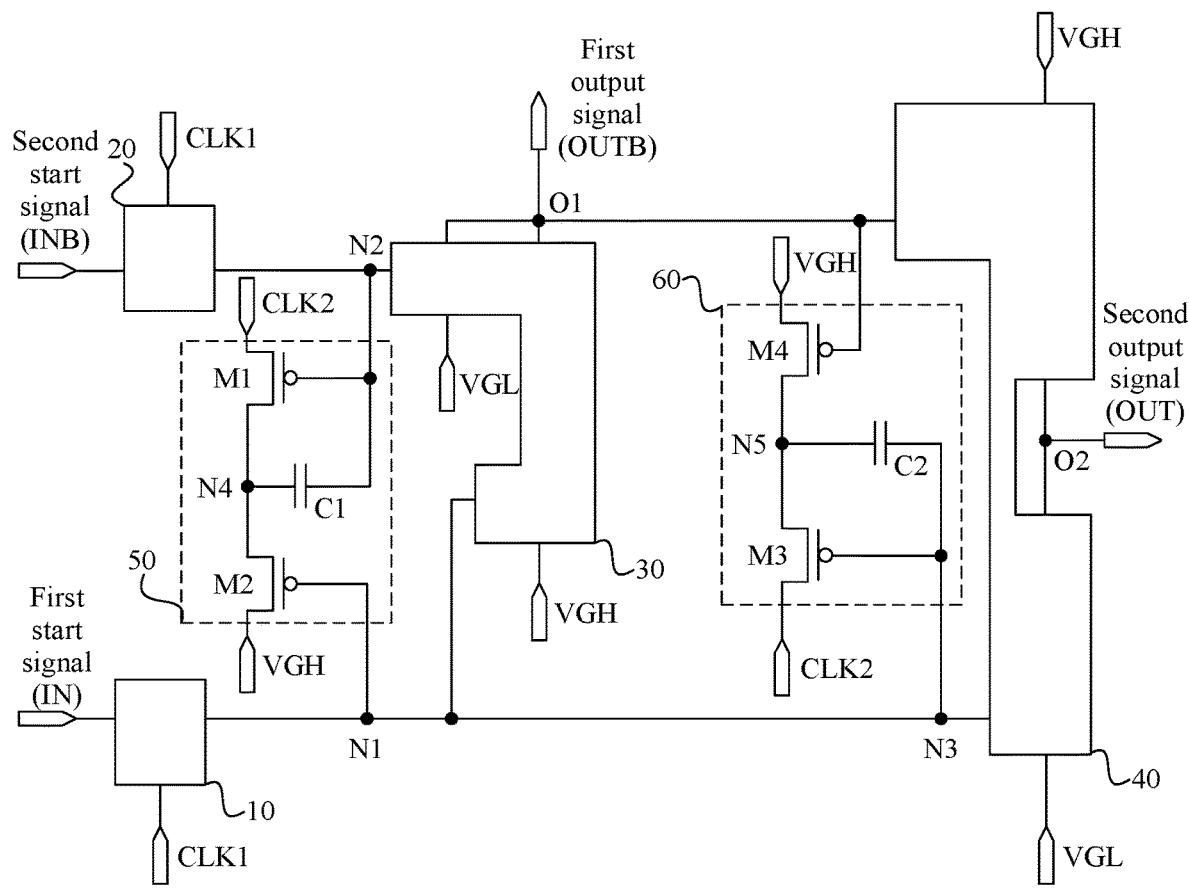
FIG. 4 is a schematic diagram of a module structure of another shift register according to an embodiment of the present application.

FIG. 4 is a schematic diagram of the module structure of another shift register according to an embodiment of the present application. As shown in FIG. 4, optionally, the second output control module 60 is configured to, in a case where the potential of the first output terminal O1 and the first potential signal VGH are the first potential and the second clock signal CLK2 jumps from the first potential to the second potential, pull down the potential of the third node N3 to a potential lower than the potential of the second potential signal VGL. The second output control module 60 includes a third transistor M3, a fourth transistor M4 and a second capacitor C2. The gate of the third transistor M3 is connected to the third node N3 and the second terminal of the second capacitor C2, the first electrode of the third transistor M3 inputs the second clock signal CLK2, and the second electrode of the third transistor M3 is connected to the first terminal of the second capacitor C2 and the second electrode of the fourth transistor M4; the gate of the fourth transistor M4 is connected to the first output terminal O1, and the first electrode of the fourth transistor M4 inputs the first potential signal VGH.

The drive timing diagram of the shift register shown in FIG. 2 can also be used to drive the shift register shown in FIG. 4 to work. In conjunction with FIGS. 2 and 4, for example, when the drive timing of the shift register is transitioned from the third stage t3 to the fourth stage t4, the second clock signal CLK2 jumps from the first potential to the second potential. The second output control module 60 can pull down the potential of the third node N3 to a potential lower than the potential of the second potential signal VGL according to the potential of the first output terminal O1, the first potential signal VGH and the second clock signal CLK2, that is, the potential of the third node N3 is pulled down to a potential lower the potential of the low-level signal, to ensure that the second output module 40 continues to transmit the second potential signal VGL to the second output terminal O2 in response to the low-level signal of the third node N3 such that the second output signal OUT is a low-level signal, thereby reducing the level loss of the low-level signal output by the second output terminal O2.

The third transistor M3 is turned on in response to the low-level signal of the third node N3 and transmits the second clock signal CLK2 to a fifth node N4 between the third transistor M3 and the fourth transistor M4 when it is on. The fourth transistor M4 is turned on in response to the low-level signal of the first output terminal O1 and transmits the first potential signal VGH to the fifth node N5 when it is on. In conjunction with FIGS. 2 and 4, at the third stage t3, the potential of the third node N3 is lo, the potential of the first output terminal O1 is high, the fourth transistor M4 is off, the third transistor M3 is on, and the second clock signal CLK2 is transmitted to the fifth node N5 such that the potential of the fifth node N5 is high. A potential difference is formed across the second capacitor C2, and the second capacitor C2 is charged. When the third stage t3 is transitioned to the fourth stage t4, the second clock signal CLK2 jumps from the first potential to the second potential, the potential of the third node N3 is close to the low potential, and the third transistor M3 continues to be on and transmits the second clock signal CLK2 to the fifth node N5 such that the potential of the fifth node N5 changes from the high potential to the low potential. Due to the coupling action of the second capacitor C2, the second capacitor C2 can couple the potential of the third node N3 to a very low potential lower than the low potential to ensure that the second output module 40 continues to transmit the second potential signal VGL to the second output terminal O2 in response to the low-level signal of the third node N3 such that the second output signal OUT is a low-level signal, thereby reducing the level loss of the low-level signal output by the second output terminal O2.

Figure 5:
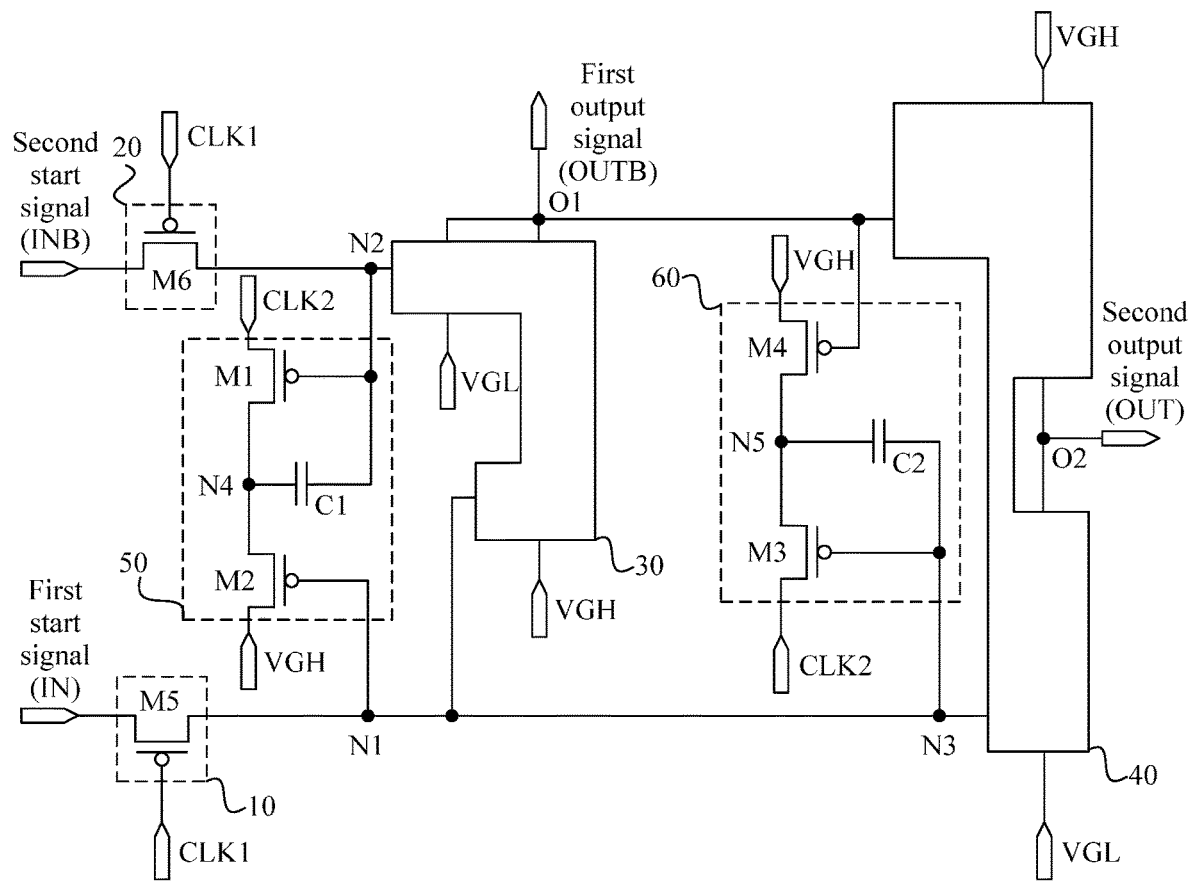
FIG. 5 is a schematic diagram of a module structure of another shift register according to an embodiment of the present application.

FIG. 5 is a schematic diagram of the module structure of another shift register according to an embodiment of the present application. As shown in FIG. 5, optionally, the first input module 10 is set to include a fifth transistor M5. The gate of the fifth transistor M5 inputs the first clock signal CLK1, the first electrode of the fifth transistor M5 inputs the first start signal IN, and the second electrode of the fifth transistor M5 is connected to the first node N1. The second input module 20 includes a sixth transistor M6. The gate of the sixth transistor M6 inputs the first clock signal CLK1, the first electrode of the sixth transistor M6 inputs the second start signal INB, and the second electrode of the sixth transistor M6 is connected to the second node N2.

The fifth transistor M5 may be turned on in response to the low-level signal of the first clock signal CLK1 and transmits the first start signal IN to the first node N1 when it is on such that the potential of the first node N1 is the same as the potential of the first start signal IN, thereby controlling the signal output by the first output terminal O1 of the first output module 30 by controlling the potential of the first node N1. The sixth transistor M6 may be turned on in response to the low-level signal of the first clock signal CLK1 and transmits the second start signal INB to the second node N2 when it is on such that the potential of the second node N2 is the same as the potential of the second start signal INB, thereby controlling the signal output by the first output terminal O1 of the first output module 30 by controlling the potential of the second node N2.

Figure 6:
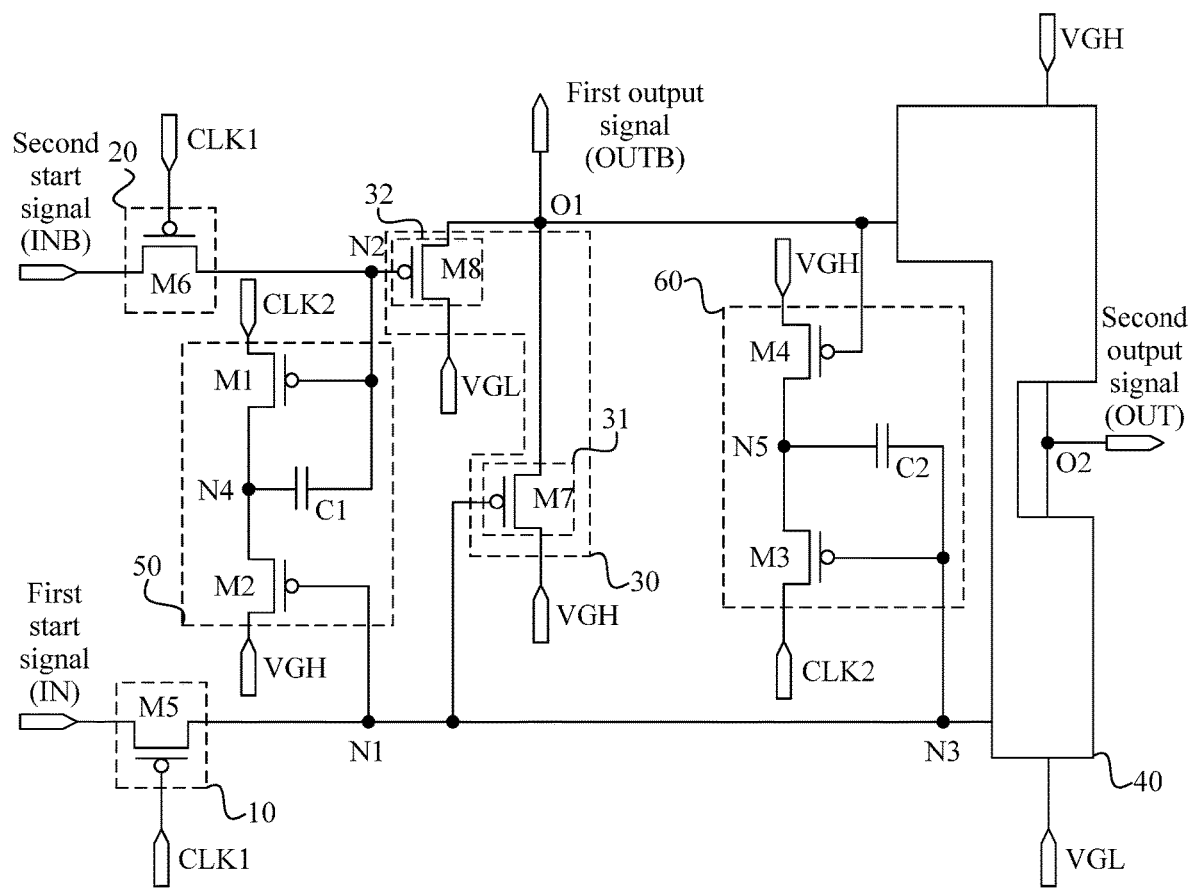
FIG. 6 is a schematic diagram of a module structure of another shift register according to an embodiment of the present application.

FIG. 6 is a schematic diagram of the module structure of another shift register according to an embodiment of the present application. As shown in FIG. 6, optionally, the first output module 30 includes a first output unit 31 and a second output unit 32. The first output unit 31 is configured to be turned on or off according to the potential of the first node N1, and the first output unit 31 is configured to transmit the first potential signal VGH to the first output terminal O1 in a case where the first output unit 31 is on, and the second output unit 32 is configured to be turned on or off according to the potential of the second node N2, and the second output unit 32 is configured to transmit the second potential signal VGL to the first output terminal O1 of the shift register in a case where the second output unit 32 is on.

For example, the first output unit 31 may be turned on in response to the low-level signal of the first node N1 and transmits the first potential signal VGH to the first output terminal O1 when it is on. The second output unit 32 may be turned on in response to the low-level signal of the second node N2 and transmits the second potential signal VGL to the first output terminal O1 when it is on. The advantages of the preceding setting are that the potential of the first node N1 can be controlled by adjusting the pulse width of the first start signal IN and in conjunction with the first clock signal CLK1 so that the pulse width of the first potential signal VGH output by the first output terminal O1 can be adjusted; since the pulse width of the second start signal INB depends on the pulse width of the first start signal IN, in this solution, the potential of the second node N2 can also be controlled by adjusting the pulse width of the first start signal IN and in conjunction with the first clock signal CLK1 so that the pulse width of the second potential signal VGL output by the first output terminal O1 can be adjusted; in this manner, the output signal of the first output terminal O1 of the shift register is a pulse signal whose pulse width is adjustable.

With reference to FIG. 6, optionally, the first output unit 31 is set to include a seventh transistor M7, the gate of the seventh transistor M7 is connected to the first node N1, the first electrode of the seventh transistor M7 inputs the first potential signal VGH, and the second electrode of the seventh transistor M7 is connected to the first output terminal O1; the second output unit 32 includes an eighth transistor M8, the gate of the eighth transistor M8 is connected to the second node N2, the first electrode of the eighth transistor M8 inputs the second potential signal VGL, and the second electrode of the eighth transistor M8 is connected to the first output terminal O1.

The seventh transistor M7 may be turned on in response to the low-level signal of the first node N1 and transmits the first potential signal VGH to the first output terminal O1 when it is on. The eighth transistor M8 may be turned on in response to the low-level signal of the second node N2 and transmits the second potential signal VGL to the first output terminal O1 when it is on. In this embodiment, the first potential signal VGH and the second potential signal VGL are alternately transmitted to the first output terminal O1 by controlling the conduction timing of the seventh transistor M7 and the eighth transistor M8 such that the output signal of the first output terminal O1 of the shift register forms a pulse signal whose pulse width is adjustable.

Figure 7:
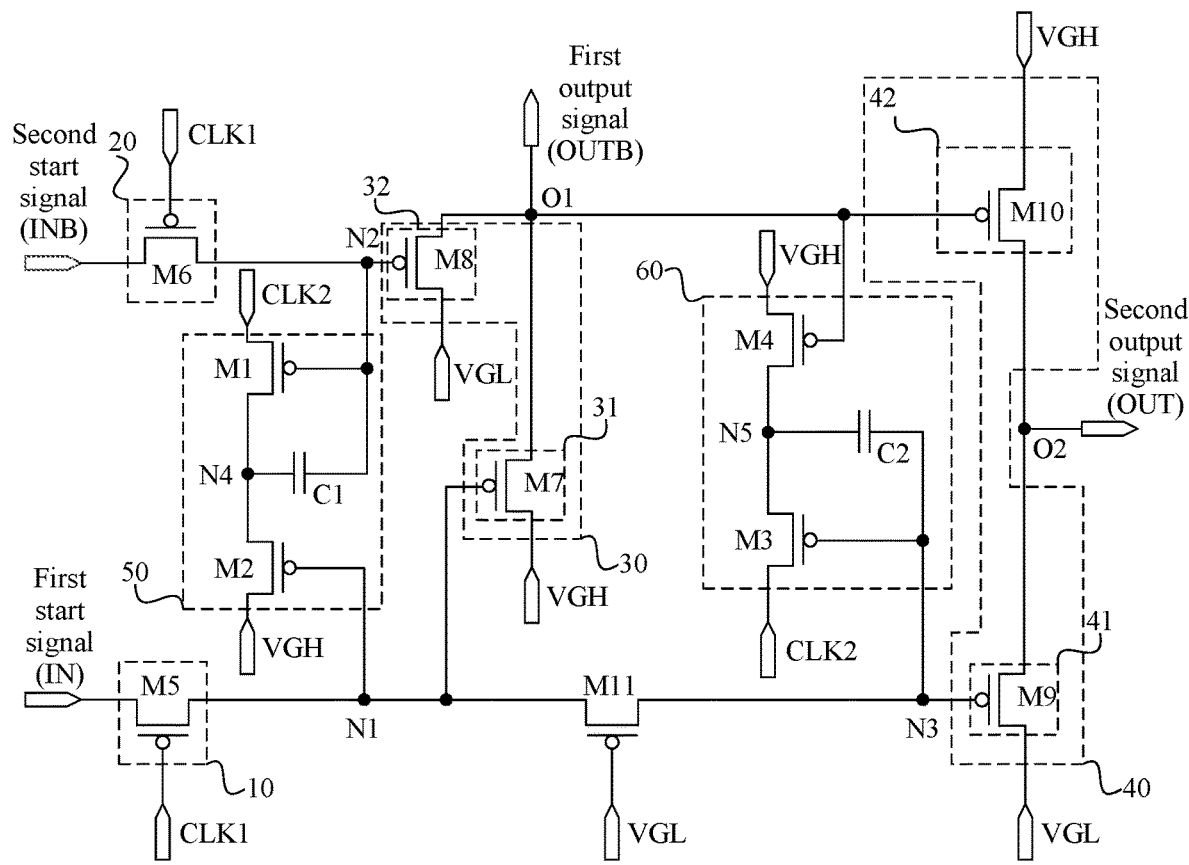
FIG. 7 is a structure diagram of a shift register according to an embodiment of the present application.
Figure 8:
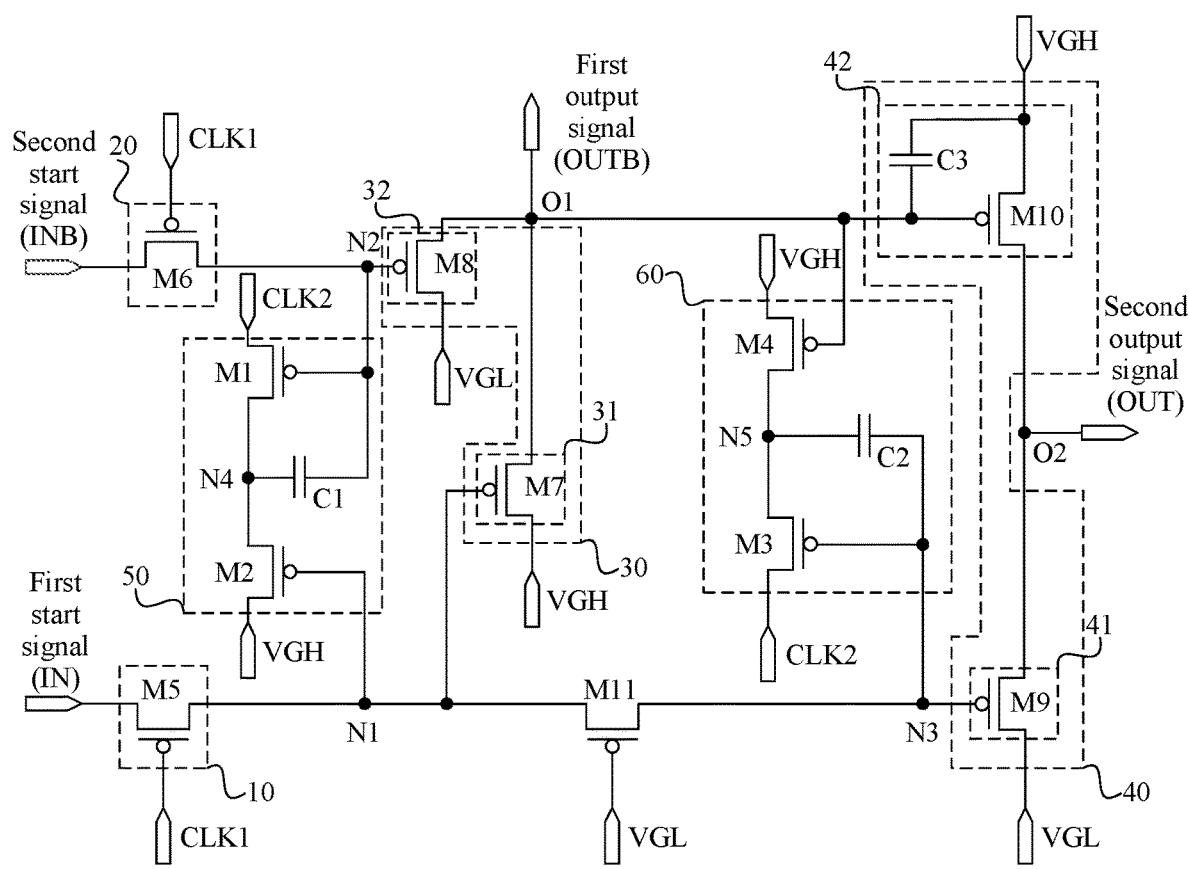
FIG. 8 is a structure diagram of another shift register according to an embodiment of the present application.

FIG. 7 is a structure diagram of a shift register according to an embodiment of the present application, and FIG. 8 is a structure diagram of another shift register according to an embodiment of the present application. As shown in FIGS. 7 and 8, optionally, the second output module 40 is set to include a third output unit 41 and a fourth output unit 42. The third output unit 41 is configured to be turned on or off according to the potential of the third node N3, and the third output unit 41 is configured to transmit the second potential signal VGL to the second output terminal O2 in a case where the third output unit 41 is on. The fourth output unit 42 is configured to be turned on or off according to the potential of the first output terminal O1, and the fourth output unit 42 is configured to transmit the first potential signal VGH to the second output terminal O2 of the shift register in a case where the fourth output unit 42 is on.

For example, the third output unit 41 may be turned on in response to the low-level signal of the third node N3 and transmits the second potential signal VGL to the second output terminal O2 when it is on. The fourth transistor M4 is turned on in response to the low-level signal of the first output terminal O1 and transmits the first potential signal VGH to the fifth node N5 when it is on. The advantages of the preceding setting are that the pulse width of the output signal of the first output terminal O1 can be adjusted by adjusting the pulse width of the first start signal IN so that the pulse width of the first potential signal VGH output by the second output terminal O2 can be adjusted; since the potential of the third node N3 is the same as the potential of the first node N1, the potential of the third node N3 can be controlled by adjusting the pulse width of the first start signal IN and in conjunction with the first clock signal CLK1 so that the pulse width of the second potential signal VGL output by the second output terminal O2 can be adjusted; in this manner, the output signal of the second output terminal O2 of the shift register is a pulse signal whose pulse width is adjustable.

With reference to FIGS. 7 and 8, optionally, the third output unit 41 is set to include a ninth transistor M9, the gate of the ninth transistor M9 is connected to the third node N3, the first electrode of the ninth transistor M9 inputs the second potential signal VGL, and the second electrode of the ninth transistor M9 is connected to the second output terminal O2; the fourth output unit 42 includes a tenth transistor M10, the gate of the tenth transistor M10 is connected to the first output terminal O1, the first electrode of the tenth transistor M10 inputs the first potential signal VGH, and the second electrode of the tenth transistor M10 is connected to the second output terminal O2.

The ninth transistor M9 may be turned on in response to the low-level signal of the third node N3 and transmits the second potential signal VGL to the second output terminal O2 when it is on. The tenth transistor M10 may be turned on in response to the low-level signal of the first output terminal O1 and transmits the first potential signal VGH to the second output terminal O2 when it is on. In this embodiment, the first potential signal VGH and the second potential signal VGL are alternately transmitted to the second output terminal O2 by controlling the conduction timing of the ninth transistor M9 and the tenth transistor M10 such that the output signal of the second output terminal O2 of the shift register forms a pulse signal whose pulse width is adjustable.

With reference to FIG. 8, optionally, the fourth output unit 42 is set to include a third capacitor C3. The first terminal of the third capacitor C3 is connected to the first electrode of the tenth transistor M10, and the second terminal of the third capacitor C3 is connected to the gate of the tenth transistor M10. The third capacitor C3 can retain the potential of the gate of the tenth transistor M10. For example, the second output terminal O2 of the shift register retains the potential of the gate of the tenth transistor M10 at a low potential in the process where the second output terminal O2 outputs the high-level signal to ensure that the tenth transistor M10 transmits the first potential signal VGH to the second output terminal O2 when the tenth transistor M10 is on.

With continued reference to FIGS. 7 and 8, optionally, the shift register further includes an eleventh transistor M11. The eleventh transistor M11 is connected between the first node N1 and the third node N3, and the gate of the eleventh transistor M11 inputs the second potential signal VGL. The eleventh transistor M11 may be at a constant on state in response to the second potential signal VGL. With reference to FIG. 2, when the third stage t3 is transitioned to the fourth stage t4, the second clock signal CLK2 jumps from the first potential to the second potential, and the second output control module 60 can couple the potential of the third node N3 to a very low potential lower than the low potential. In this embodiment, the eleventh transistor M11 is set to help isolate the very low potential that occurs in the third node N3, thereby preventing the very low potential of the third node N3 from being transmitted to the first node N1 and thus preventing the normal working of the shift register from being affected.

The drive timing diagram of the shift register shown in FIG. 2 can also be used to drive the shift registers shown in FIGS. 7 and 8 to work. The working principle of the shift register provided by the embodiments of the present application is described in conjunction with FIGS. 2, 7 and 8. For example, the working process of the shift register includes a first stage t1, a second stage t2, a third stage t3, a fourth stage t4, a fifth stage t5 and a sixth stage t6.

At the first stage t1, the first clock signal CLK1 is low, the second clock signal CLK2 is high, the first start signal IN is high, and the second start signal INB is low. The fifth transistor M5 and the sixth transistor M6 are on, the eleventh transistor M11 is normally on, the fifth transistor M5 transmits the first start signal IN to the first node N1 such that the potential of the first node N1 is high, the potential of the third node N3 is the same as the potential of the first node N1, and the sixth transistor M6 transmits the second start signal INB to the second node N2 such that the potential of the second node N2 is low. The second transistor M2, the seventh transistor M7, the third transistor M3 and the ninth transistor M9 are off, and the first transistor M1 and the eighth transistor M8 are on. The first transistor M1 transmits the second clock signal CLK2 to the fourth node N4 such that the potential of the fourth node N4 is high. A potential difference is formed across the first capacitor C1, and the first capacitor C1 is charged. The eighth transistor M8 transmits the second potential signal VGL to the first output terminal O1 such that the first output signal OUTB is a low-level signal. The fourth transistor M4 and the tenth transistor M10 are on, the fourth transistor M4 transmits the first potential signal VGH to the fifth node N5 such that the potential of the fifth node N5 is high, and the tenth transistor M10 transmits the first potential signal VGH to the second output terminal O2 such that the second output signal OUT is a high-level signal. At the first stage t1, the first output signal OUTB coincides with the second start signal INB, and the second output signal OUT coincides with the first start signal IN.

At the second stage t1, the first clock signal CLK1 is high, the second clock signal CLK2 jumps from the high level to the low level, the first start signal IN is low, and the second start signal INB is high. The fifth transistor M5 and the sixth transistor M6 are off, the potential of the first node N1 is high, the potential of the third node N3 is the same as the potential of the first node N1, and the potential of the second node N2 is low. The second transistor M2, the seventh transistor M7, the third transistor M3 and the ninth transistor M9 are off, and the first transistor M1 and the eighth transistor M8 are on. The first transistor M1 transmits the second clock signal CLK2 to the fourth node N4 such that the potential of the fourth node N4 changes from the high potential to the low potential. Due to the coupling action of the first capacitor C1, the first capacitor C1 can couple the potential of the second node N2 to a very low potential lower than the low potential to increase the degree of conduction of the eighth transistor M8 such that the eighth transistor M8 is fully on to ensure that the eighth transistor M8 transmits the second potential signal VGL to the first output terminal O1 such that the first output signal OUTB is a low-level signal. The fourth transistor M4 and the tenth transistor M10 are on, the fourth transistor M4 transmits the first potential signal VGH to the fifth node N5 such that the potential of the fifth node N5 is high, and the tenth transistor M10 transmits the first potential signal VGH to the second output terminal O2 such that the second output signal OUT is a high-level signal. At the second stage t2, the first output signal OUTB still coincides with the second start signal INB, and the second output signal OUT still coincides with the first start signal IN.

At the third stage t3, the first clock signal CLK1 is low, the second clock signal CLK2 is high, the first start signal IN is low, and the second start signal INB is high. The fifth transistor M5 and the sixth transistor M6 are on, the fifth transistor M5 transmits the first start signal IN to the first node N1 such that the potential of the first node N1 is low, the potential of the third node N3 is the same as the potential of the first node N1, and the sixth transistor M6 transmits the second start signal INB to the second node N2 such that the potential of the second node N2 is high. The first transistor M1 and the eighth transistor M8 are off, and the second transistor M2, the seventh transistor M7, the third transistor M3 and the ninth transistor M9 are on. The seventh transistor M7 transmits the first potential signal VGH to the first output terminal O1 such that the first output signal OUTB is a low-level signal, and the fourth transistor M4 and the tenth transistor M10 are off. The third transistor M3 transmits the second clock signal CLK2 to the fifth node N5 such that the potential of the fifth node N5 is high. A potential difference is formed across the second capacitor C2, and the second capacitor C2 is charged. The ninth transistor M9 transmits the second potential signal VGL to the second output terminal O2 such that the second output signal OUT is a low-level signal. At the third stage t3, the first output signal OUTB is inverted and coincides with the inverted second start signal INB, and the second output signal OUT is inverted and coincides with the inverted first start signal IN.

At the fourth stage t4, the first start signal IN remains low, and the second start signal INB remains high. When the first clock signal CLK1 jumps from the low level of the third stage t3 to the high level and the second clock signal CLK2 jumps from the high level of the third stage t3 to the low level, the fifth transistor M5 and the sixth transistor M6 are off, the potential of the first node N1 is low, the potential of the third node N3 is the same as the potential of the first node N1, and the potential of the second node N2 is high. The first transistor M1 and the eighth transistor M8 are off, and the second transistor M2, the seventh transistor M7, the third transistor M3 and the ninth transistor M9 are on. The seventh transistor M7 continues to transmit the first potential signal VGH to the first output terminal O1 such that the first output signal OUTB is a high-level signal, and the fourth transistor M4 and the tenth transistor M10 are off. The third transistor M3 transmits the second clock signal CLK2 to the fifth node N5 such that the potential of the fifth node N5 jumps from the high potential to the low potential. Due to the coupling action of the second capacitor C2, the second capacitor C2 can couple the potential of the third node N3 to a very low potential lower than the low potential to increase the degree of conduction of the ninth transistor M9 such that the ninth transistor M9 is fully on to ensure that the ninth transistor M9 transmits the second potential signal VGL to the second output terminal O2 such that the second output signal OUT is a low-level signal. As shown in FIG. 2, since the low-level signal output by the second output terminal O2 becomes lower after the third stage t3 is transitioned to the fourth stage t4, in this embodiment, the second output control module 60 composed of the third transistor M3, the fourth transistor M4 and the second capacitor C2 is provided, thereby reducing the level loss of the low-level signal output by the second output terminal O2 at the third stage t3 and prolonging the low level time of the output signal of the shift register. At the fourth stage t4, the first output signal OUTB remains a high-level signal, and the second output signal OUT remains a low-level signal.

At the fifth stage t5, the first clock signal CLK1 is low, the second clock signal CLK2 is high, the first start signal IN is high, and the second start signal INB is low. The first transistor M1, the fourth transistor M4, the fifth transistor M5, the sixth transistor M6, the eighth transistor M8, the tenth transistor M10 and the eleventh transistor M11 are on, and the remaining transistors are off. The potentials of the first node N1 and the third node N3 are high, the potential of the second node N2 is low, and the potential of the fourth node N4 is high. A potential difference is formed across the first capacitor C1, and the first capacitor C1 is charged. The eighth transistor M8 transmits the second potential signal VGL to the first output terminal O1 such that the first output signal OUTB is a low-level signal. The tenth transistor M10 transmits the first potential signal VGH to the second output terminal O2 such that the second output signal OUT is a high-level signal. At the fifth stage t5, the first output signal OUTB is inverted and coincides with the inverted second start signal INB, and the second output signal OUT is inverted and coincides with the inverted first start signal IN.

At the sixth stage t6, the first start signal IN remains high, and the second start signal INB remains low. When the first clock signal CLK1 jumps from the low level of the fifth stage t5 to the high level and the second clock signal CLK2 jumps from the high level of the fifth stage t5 to the low level, the fifth transistor M5 and the sixth transistor M6 are off, the potential of the first node N1 is high, the potential of the third node N3 is the same as the potential of the first node N1, and the potential of the second node N2 is low. The second transistor M2, the seventh transistor M7, the third transistor M3 and the ninth transistor M9 are off, and the first transistor M1 and the eighth transistor M8 are on. The first transistor M1 transmits the second clock signal CLK2 to the fourth node N4 such that the potential of the fourth node N4 changes from the high potential to the low potential. Due to the coupling action of the first capacitor C1, the first capacitor C1 can couple the potential of the second node N2 to a very low potential lower than the low potential to increase the degree of conduction of the eighth transistor M8 such that the eighth transistor M8 is fully on to ensure that the eighth transistor M8 transmits the second potential signal VGL to the first output terminal O1 such that the first output signal OUTB is a low-level signal. As shown in FIG. 2, since the low-level signal output by the first output terminal O1 becomes lower after the fifth stage t5 is transitioned to the sixth stage t6, in this embodiment, the first output control module 50 composed of the first transistor M1, the second transistor M2 and the first capacitor C1 is provided, thereby reducing the level loss of the low-level signal output by the first output terminal O1 at the fifth stage t5 and prolonging the low level time of the output signal of the shift register. At the sixth stage t6, the fourth transistor M4 and the tenth transistor M10 are on, the fourth transistor M4 transmits the first potential signal VGH to the fifth node N5 such that the potential of the fifth node N5 is high, and the tenth transistor M10 transmits the first potential signal VGH to the second output terminal O2 such that the second output signal OUT is a high-level signal. At the sixth stage t6, the first output signal OUTB remains consistent with the second start signal INB, and the second output signal OUT remains consistent with the first start signal IN.

In this embodiment of the present application, the first transistor M1 and the second transistor M2 in the first output control module 50, the third transistor M3 and the fourth transistor M4 in the second output control module 60, the fifth transistor M5 in the first input module 10, the sixth transistor M6 in the second input module 20, the seventh transistor M7 in the first output unit 31, the eighth transistor M8 in the second output unit 32, the ninth transistor M9 in the third output unit 41 and the tenth transistor M10 and the eleventh transistor M11 in the fourth output unit 42 may all be thin-film transistors, the display panel also includes a pixel circuit composed of thin-film transistors, and multiple transistors in the shift register can be manufactured in the same process flow as the transistors in the pixel circuit, thereby simplifying the manufacturing process of the display panel.

Figure 9:
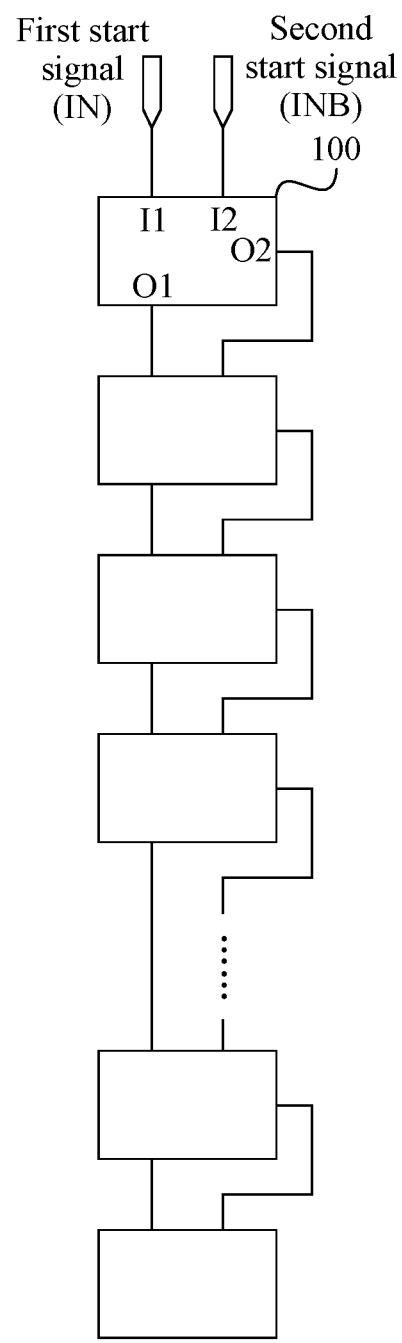
FIG. 9 is a schematic diagram of a module structure of a gate drive circuit according to an embodiment of the present application.

An embodiment of the present application further provides a gate drive circuit. The gate drive circuit provided by this embodiment of the present application includes shift registers provided by any of the preceding embodiments of the present application. FIG. 9 is a schematic diagram of the module structure of a gate drive circuit according to an embodiment of the present application. As shown in FIG. 9, the gate drive circuit includes multiple cascaded shift registers 100. The first start signal input terminal I1 of a first stage shift register 100 accesses the first start signal IN, the second start signal input terminal I2 of the first stage shift register 100 accesses the second start signal INB, the first output terminal O1 of the first stage shift register 100 is electrically connected to the second start signal input terminal I2 of a next stage shift register 100, and the second output terminal O2 of the first stage shift register 100 is electrically connected to the first start signal input terminal I1 of the next stage shift register 100.

In conjunction with FIGS. 1 and 9, since the gate drive circuit includes multiple cascaded shift registers 100 and the shift register in this embodiment can shift the first start signal IN to obtain the second output signal OUT and shift the second start signal INB to obtain the first output signal OUTB, when the shift register is applied to the gate drive circuit, the second output signal OUT output by the current stage shift register can also serve as the first start signal IN input to the next stage shift register, and the first output signal OUTB output from the current stage shift register can also serve as the second start signal INB input to the next stage shift register, thereby facilitating the transfer of the output signal of the current stage shift register to the next stage shift register. Further, the low level loss of the output signal of the shift register can be reduced through the first output control module 50 and the second output control module 60 in the shift register, thereby reducing the level loss of the active signal transmitted from the current stage shift register to the next stage shift register.

The gate drive circuit provided by this embodiment of the present application includes the shift register provided by any of the preceding embodiments of the present application and thus has the function modules and effects corresponding to the shift register, and the details are not repeated here.

Figure 10:
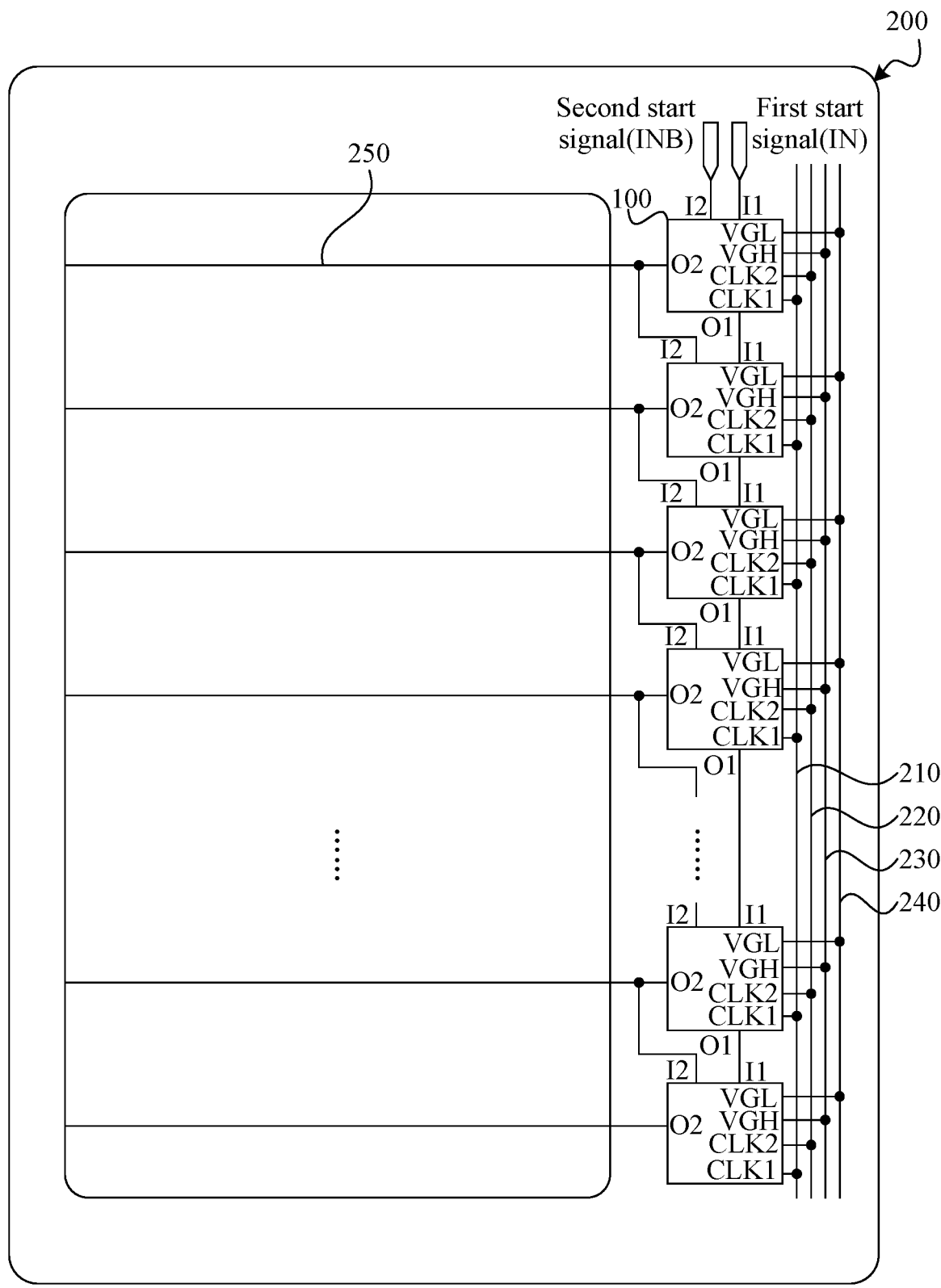
FIG. 10 is a structure diagram of a display panel according to an embodiment of the present application.

An embodiment of the present application further provides a display panel. FIG. 10 is a structure diagram of a display panel according to an embodiment of the present application. In conjunction with FIGS. 1 and 10, the display panel 200 includes the gate drive circuit provided by the preceding embodiment and further includes a first clock signal line 210, a second clock signal line 220, a first potential signal line 230 and a second potential signal line 240. The first clock signal line 210 is configured to transmit the first clock signal CLK1 to the shift register 100, the second clock signal line 220 is configured to transmit the second clock signal CLK2 to the shift register 100, the first potential signal line 230 is configured to transmit the first potential signal VGH to the shift register 100, and the second potential signal line 240 is configured to transmit the second potential signal VGL to the shift register 100.

The display panel may be, for example, an organic light-emitting diode display panel or a liquid crystal display panel. Optionally, the display panel may further include a first start signal line which is configured to transmit the first start signal IN to the first stage shift register 100 in the gate drive circuit, and the shift register may also generate the inverted signal of the first start signal IN according to the received first start signal IN through its internal structure to obtain the second start signal INB and inputs the second start signal INB to the second start signal input terminal I2 of the first stage shift register 100. The first stage shift register can shift the first start signal IN and the second start signal INB to the next stage shift register. In shift registers of adjacent two stages, a next stage shift register can shift and output the signal output from a previous stage shift register, and the output signal of the second output terminal O2 of each stage shift register may be the gate drive signal of transistors of the pixel circuit in the display panel. Therefore, the display panel provided by this embodiment of the present application achieves the function of outputting gate drive signals (for example, the gate drive signals may be scan signals or light emission control signals) line by line, and gate drive signals output by the multi-stage shift register have an adjustable pulse width and are stable.

The display panel provided by this embodiment of the present application includes the gate drive circuit provided by any of the preceding embodiments of the present application and the shift registers in the gate drive circuit and thus has the function modules and effects corresponding to the gate drive circuit and the shift registers in the gate drive circuit, and the details are not repeated here.

Figure 11:
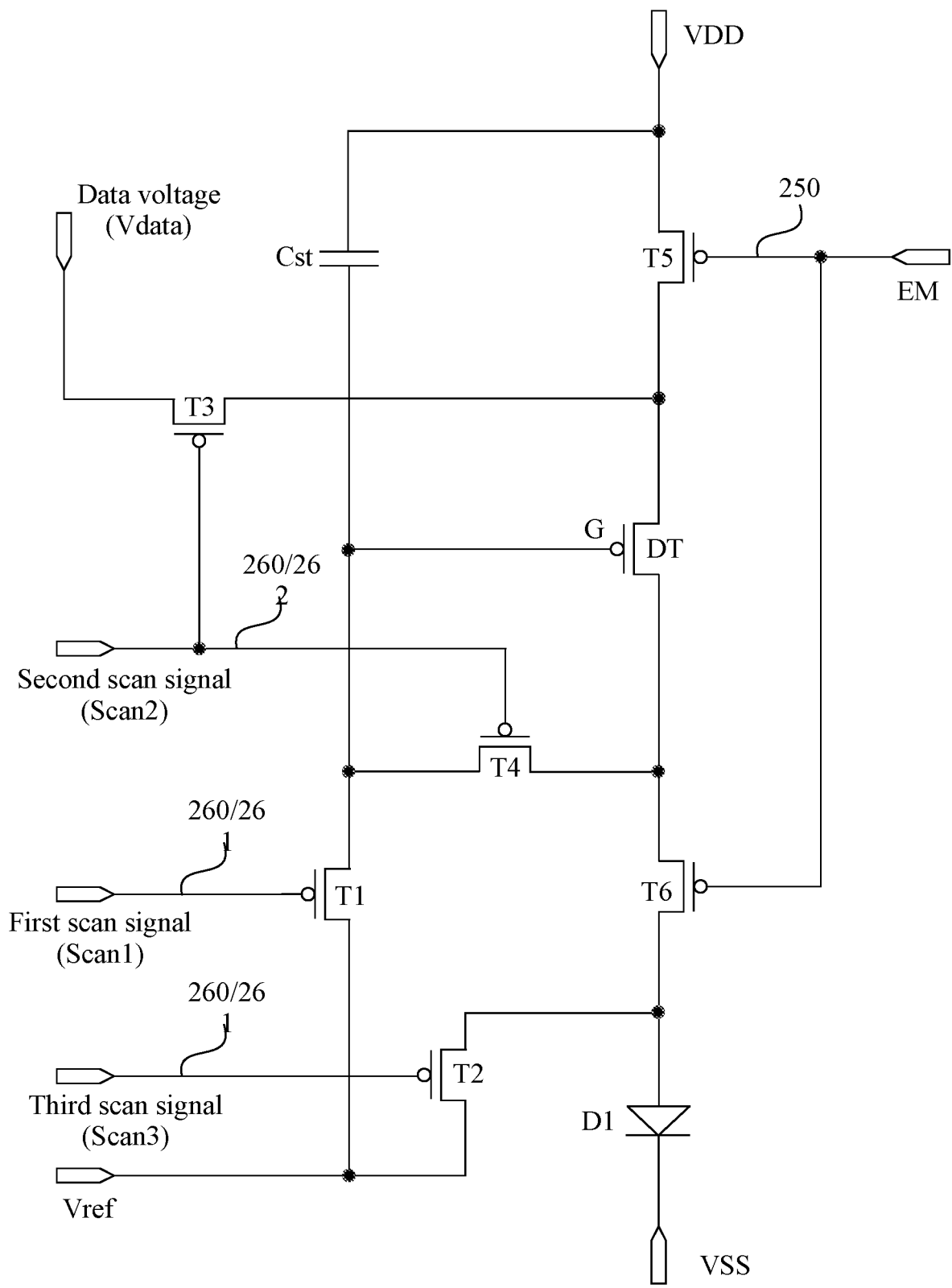
FIG. 11 is a structure diagram of a pixel circuit according to an embodiment of the present application.

FIG. 11 is a structure diagram of a pixel circuit according to an embodiment of the present application. FIG. 11 exemplarily shows a case where the pixel circuit includes seven thin-film transistors and one storage capacitor. In conjunction with FIGS. 10 and 11, optionally, the display panel 200 further includes a light emission control signal line 250. The second output terminal O2 of the shift register 100 is connected to the light emission control signal line 250, and a signal output by the second output terminal O2 of the shift register 100 is taken as a light emission control signal EM.

The pixel circuit in the display panel is connected to a light-emitting device D1. The pixel circuit may include a storage capacitor Cst, a drive transistor DT, a first initialization transistor T1 configured to transmit an initialization signal Vref to the gate G of the drive transistor DT, a second initialization transistor T2 configured to transmit an initialization signal Vref to the anode of the light-emitting device D1, a data write transistor T3 configured to write a data voltage Vdata to the storage capacitor Cst, a threshold compensation transistor T4 configured to perform threshold voltage compensation on the drive transistor DT, a first light emission control transistor T5 and a second light emission control transistor T6, where the first light emission control transistor T5 and the second light emission control transistor T6 are configured to control the light emission stage of the light-emitting device D1.

The light emission control signal line 250 is configured to transmit the light emission control signal EM to the gate of the first light emission control transistor T5 and the gate of the second light emission control transistor T6. In conjunction with FIGS. 1, 10 and 11, when the pulse width of the first start signal IN of the shift register is set to be larger than the pulse width of the first clock signal CLK1 and the second clock signal CLK2, the first start signal IN can be shifted by the shift register to obtain the second output signal OUT, and the second start signal INB can be shifted to obtain the first output signal OUTB. Compared with the related art, the pulse width of the first output signal OUTB and the second output signal OUT of the shift register is larger than the pulse width of the clock signal, the low-level loss of the first output signal OUTB output by the shift register is reduced through the first output control module 50, and the low level loss of the second output signal OUT of the shift register is reduced through the second output control module 60, which facilitates the prolonging of the low level time of the output signal of the shift register and improving the stability of the output signal of the shift register. When the output signal of the shift register is used as the gate drive signal of the light emission control transistor in the pixel circuit, the display effect is also improved.

Figure 12:
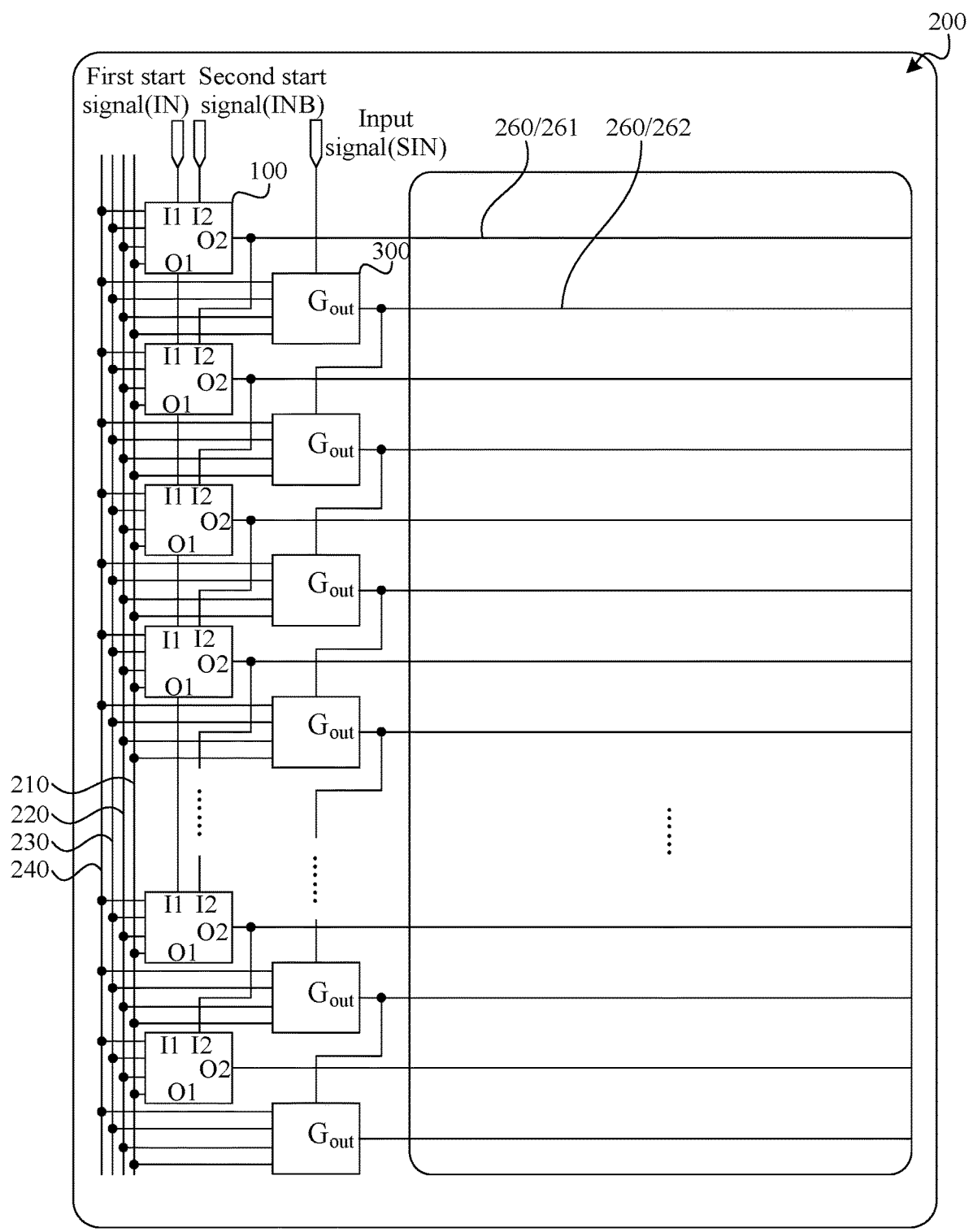
FIG. 12 is a structure diagram of another display panel according to an embodiment of the present application.

FIG. 12 is a structure diagram of another display panel according to an embodiment of the present application. In conjunction with FIGS. 11 and 12, optionally, the display panel 200 further includes a scan line 260. The second output terminal O2 of the shift register 100 is connected to the scan line 260, and a signal output by the second output terminal O2 of the shift register 100 is taken as a scan signal. The scan line 260 is configured to provide a scan signal for the gate of the transistors in the pixel circuit. For example, the scan line 260 provides the scan signal for the gate of the first initialization transistor T1 and the gate of the second initialization transistor T2.

In conjunction with FIGS. 11 and 12, optionally, the display panel 200 includes a pixel circuit. The pixel circuit includes a drive transistor DT, a light-emitting device D1, a first initialization transistor T1 and a second initialization transistor T2. The first initialization transistor T1 is configured to initialize the potential of the gate G of the drive transistor DT, and the second initialization transistor T2 is configured to initialize the anode of the light-emitting device D1. The scan line 260 is connected to the gate of the first initialization transistor T1 and/or the gate of the second initialization transistor T2. When the pulse width of the first start signal IN of the shift register is set to be larger than the pulse width of the first clock signal CLK1 and the second clock signal CLK2, compared with the related art, the pulse width of the first output signal OUTB and the second output signal OUT of the shift register provide by the embodiments of the present application is larger than the pulse width of the clock signal, and the low-level loss of the output signal of the shift register can be reduced, facilitating the prolonging of the low level time of the output signal of the shift register. When the signal output by the second output terminal O2 of the shift register is taken as the scan signal for driving the first initialization transistor T1 and the second initialization transistor T2, the initialization time of the gate of the drive transistor and the anode of the light-emitting device is prolonged, thereby alleviating problems such as the afterimage of the display image and the display abnormality caused by insufficient initialization time and improving the display effect.

Figure 13:
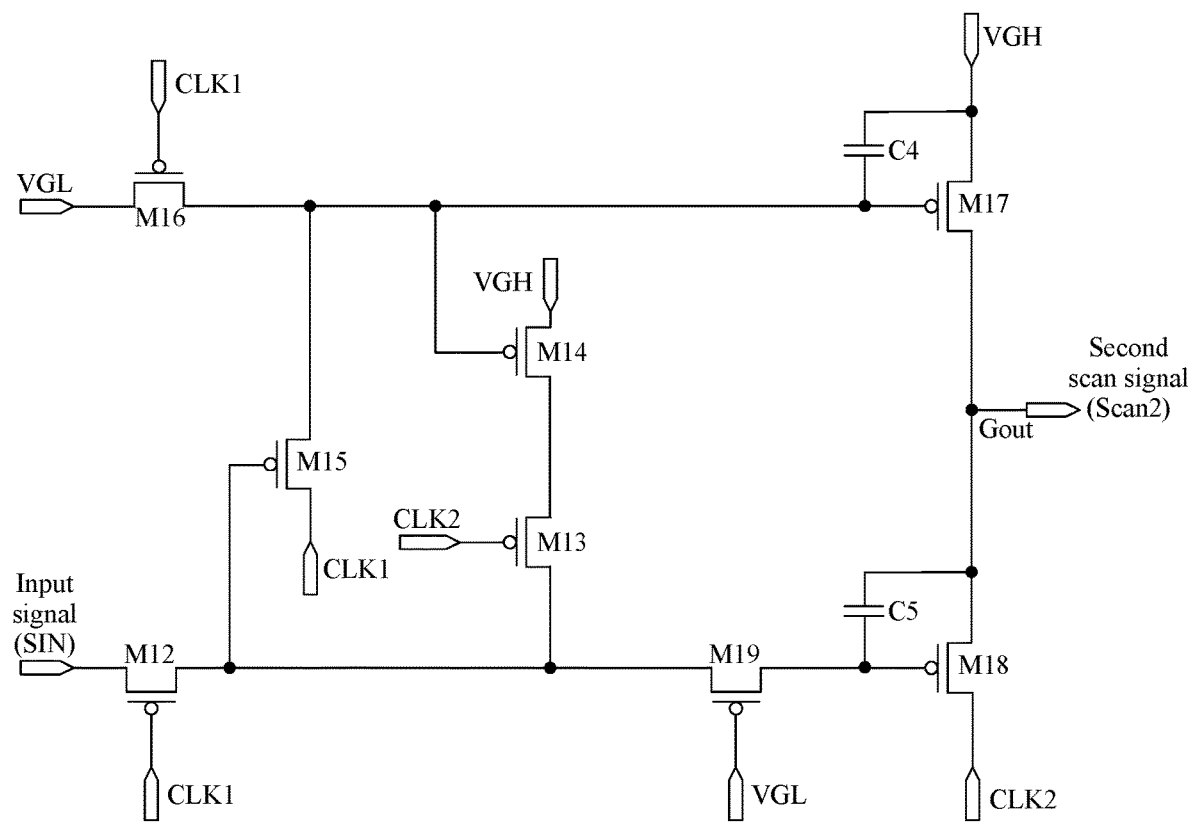
FIG. 13 is a structure diagram of a shift register in the related art.

FIG. 13 is a structure diagram of a shift register in the related art. In conjunction with FIGS. 1 and 11 to 13, optionally, the gate drive circuit in the display panel is set to include multiple cascaded shift registers 100 provided by any of the preceding embodiments of the present application and may further include a shift register 300 in the related art. The second output terminal O2 of the shift register 100 and the output terminal Gout of the shift register 300 may both be connected to the scan line 260, the shift register 100 is connected to a first scan line 261, and the first scan line 261 may transmit a first scan signal Scan1 to the gate of the first initialization transistor T1 in the pixel circuit or may transmit a third scan signal Scan3 to the gate of the second initialization transistor T2 in the pixel circuit. The output terminal Gout of the shift register 300 is connected to a second scan line 262, and the second scan line 262 may transmit a second scan signal Scan2 to the gate of the data write transistor T3 and the gate of the threshold compensation transistor T4 in the pixel circuit.

The shift register 300 includes a twelfth transistor M12, a thirteenth transistor M13, a fourteenth transistor M14, a fifteenth transistor M15, a sixteenth transistor M16, a seventeenth transistor M17, an eighteenth transistor M18, a nineteenth transistor M19, a fourth capacitor C4 and a fifth capacitor C5. The shift register 300 has a single input signal SIN and a single output second scan signal Scan2. The pulse width of the active signal output by the output terminal Gout of the shift register 300 in the related art generally depends on the pulse width of the active signals of the first clock signal CLK1 and the second clock signal CLK2, and when the pulse width of the active signal of the first start signal IN of the shift register 100 is set to be larger than the pulse width of the active signals of the first clock signal CLK1 and the second clock signal CLK2, the pulse width of the active signal output by the second output terminal O2 of the shift register 100 is larger than the pulse width of the active signal output by the output terminal Gout of the shift register 300 such that the active pulse width of the output signal of the shift register 100 is no longer limited by the line scan time of the display panel.

When the pixel circuit in the display panel is driven to work, the shift register 100 provided by the embodiments of the present application and the shift register 300 in the related art may be used together so that the signal output by the second output terminal O2 of the shift register 100 is used as the first scan signal Scan1 for driving the first initialization transistor T1 to work and/or as the third scan signal 263 for driving the second initialization transistor T2 to work and the signal output by the output terminal Gout of the shift register 300 is used as the second scan signal Scan2 for driving the data write transistor T3 and the threshold compensation transistor T4 to work. The advantages of the preceding setting are that in one aspect, the data write transistor T3 and the threshold compensation transistor T4 can be driven to normally work through the shift register 300, and in another aspect, since the pulse width of the output signal of the shift register 100 is adjustable, the signal output by the second output terminal O2 of the shift register 100 is used as the first scan signal Scan1 and/or the third scan signal Scan3, which facilitates the prolonging of the initialization time of the gate of the drive transistor and the anode of the light-emitting device, thereby alleviating problems such as the afterimage of the display image and the display abnormality caused by insufficient initialization time and improving the display effect. Further, the scan line 260 connected to the second output terminal O2 of the shift register 100 may be simultaneously connected to the initialization transistors (including the first initialization transistor T1 and/or the second initialization transistor T2) in multiple rows of pixel circuits so that the display panel can simultaneously initialize a number of rows of pixel circuits without causing a logic error and the wide pulse signal output by the second output terminal O2 of the shift register 100 is no longer limited by the line scan time of the pixel circuit.

What is claimed is:

1. A shift register, comprising: a first input module, a second input module, a first output module, a second output module, a first output control module and a second output control module;

wherein the first input module is configured to control a potential of a first node according to a first start signal and a first clock signal, the second input module is configured to control a potential of a second node according to a second start signal and the first clock signal, and a potential of the second start signal is opposite to a potential of the first start signal;

the first output control module is configured to control the potential of the second node according to the potential of the first node, a first potential signal and a second clock signal, and the first output module is configured to transmit the first potential signal or a second potential signal to a first output terminal of the shift register according to the potential of the first node and the potential of the second node;

the second output control module is configured to control a potential of a third node connected to the first node according to a potential of the first output terminal, the first potential signal and the second clock signal, and the second output module is configured to transmit the first potential signal or the second potential signal to a second output terminal of the shift register according to the potential of the first output terminal and the potential of the third node.

2. The shift register according to claim 1, wherein the first output control module is configured to, in a case where the potential of the first node and the first potential signal are a first potential and the second clock signal jumps from the first potential to a second potential, pull down the potential of the second node to a potential lower than a potential of the second potential signal;

the first output control module comprises a first transistor, a second transistor and a first capacitor;

a gate of the first transistor is connected to the second node and a second terminal of the first capacitor, a first electrode of the first transistor is configured to input the second clock signal, and a second electrode of the first transistor is connected to a first terminal of the first capacitor and a second electrode of the second transistor; a gate of the second transistor is connected to the first node, and a first electrode of the second transistor is configured to input the first potential signal.

3. The shift register according to claim 1, wherein the second output control module is configured to, in a case where the potential of the first output terminal and the first potential signal are a first potential and the second clock signal jumps from the first potential to a second potential, pull down the potential of the third node to a potential lower than a potential of the second potential signal;

the second output control module comprises a third transistor, a fourth transistor and a second capacitor;

a gate of the third transistor is connected to the third node and a second terminal of the second capacitor, a first electrode of the third transistor is configured to input the second clock signal, and a second electrode of the third transistor is connected to a first terminal of the second capacitor and a second electrode of the fourth transistor; a gate of the fourth transistor is connected to the first output terminal, and a first electrode of the fourth transistor is configured to input the first potential signal.

4. The shift register according to claim 1, wherein the first input module comprises a fifth transistor, a gate of the fifth transistor is configured to input the first clock signal, a first electrode of the fifth transistor is configured to input the first start signal, and a second electrode of the fifth transistor is connected to the first node;

the second input module comprises a sixth transistor, a gate of the sixth transistor is configured to input the first clock signal, a first electrode of the sixth transistor is configured to input the second start signal, and a second electrode of the sixth transistor is connected to the second node.

5. The shift register according to claim 1, wherein the first output module comprises a first output unit and a second output unit;

the first output unit is configured to be turned on or off according to the potential of the first node, and the first output unit is configured to transmit the first potential signal to the first output terminal in a case where the first output unit is on, and the second output unit is configured to be turned on or off according to the potential of the second node, and the second output unit is configured to transmit the second potential signal to the first output terminal of the shift register in a case where the second output unit is on.

6. The shift register according to claim 5, wherein the first output unit comprises a seventh transistor, a gate of the seventh transistor is connected to the first node, a first electrode of the seventh transistor is configured to input the first potential signal, and a second electrode of the seventh transistor is connected to the first output terminal.

7. The shift register according to claim 5, wherein the second output unit comprises an eighth transistor, a gate of the eighth transistor is connected to the second node, a first electrode of the eighth transistor is configured to input the second potential signal, and a second electrode of the eighth transistor is connected to the first output terminal.

8. The shift register according to claim 1, wherein the second output module comprises a third output unit and a fourth output unit;

the third output unit is configured to be turned on or off according to the potential of the third node, and the third output unit is configured to transmit the second potential signal to the second output terminal in a case where the third output unit is on, and the fourth output unit is configured to be turned on or off according to the potential of the first output terminal, and the fourth output unit is configured to transmit the first potential signal to the second output terminal of the shift register in a case where the fourth output unit is on.

9. The shift register according to claim 8, wherein the third output unit comprises a ninth transistor, a gate of the ninth transistor is connected to the third node, a first electrode of the ninth transistor is configured to input the second potential signal, and a second electrode of the ninth transistor is connected to the second output terminal.

10. The shift register according to claim 8, wherein the fourth output unit comprises a tenth transistor, a gate of the tenth transistor is connected to the first output terminal, a first electrode of the tenth transistor is configured to input the first potential signal, and a second electrode of the tenth transistor is connected to the second output terminal.

11. The shift register according to claim 10, wherein the fourth output unit further comprises a third capacitor, a first terminal of the third capacitor is connected to the first electrode of the tenth transistor, and a second terminal of the third capacitor is connected to the gate of the tenth transistor.

12. The shift register according to claim 1, further comprising an eleventh transistor, wherein the eleventh transistor is connected between the first node and the third node, and a gate of the eleventh transistor is configured to input the second potential signal.

13. A gate drive circuit, comprising a plurality of shift registers according claim 1, wherein the plurality of shift registers are cascaded;
   a first start signal input terminal of a first stage shift register is configured to access the first start signal, a second start signal input terminal of the first stage shift register is configured to access the second start signal, a first output terminal of the first stage shift register is electrically connected to a second start signal input terminal of a next stage shift register, and a second output terminal of the first stage shift register is electrically connected to a first start signal input terminal of the next stage shift register.

14. A display panel, comprising the gate drive circuit according to claim 13 and further comprising a first clock signal line, a second clock signal line, a first potential signal line and a second potential signal line;
   wherein the first clock signal line is configured to transmit a first clock signal to the shift register, the second clock signal line is configured to transmit a second clock signal to the shift register, the first potential signal line is configured to transmit a first potential signal to the shift register, and the second potential signal line is configured to transmit a second potential signal to the shift register.

15. The display panel according to claim 14, further comprising a light emission control signal line, wherein the second output terminal of the shift register is connected to the light emission control signal line, and the light emission control signal line is configured to take a signal output by the second output terminal of the shift register as a light emission control signal.

16. The display panel according to claim 14, further comprising a scan line, wherein the second output terminal of the shift register is connected to the scan line, and the scan line is configured to take a signal output by the second output terminal of the shift register as a scan signal.

17. The display panel according to claim 16, further comprising a pixel circuit, wherein the pixel circuit comprises a drive transistor, a light-emitting device, a first initialization transistor and a second initialization transistor, the first initialization transistor is configured to initialize a potential of a gate of the drive transistor, the second initialization transistor is configured to initialize an anode of the light-emitting device, and the scan line is connected to at least one of a gate of the first initialization transistor and a gate of the second initialization transistor.

* * * * *